(12) United States Patent
Cousins

(10) Patent No.: US 12,316,350 B1
(45) Date of Patent: *May 27, 2025

(54) SYSTEMS, METHODS AND COMPUTER PROGRAM PRODUCTS INCLUDING FEATURES OF TRANSFORMING DATA INVOLVING A SECURE FORMAT FROM WHICH THE DATA IS RECOVERABLE

(71) Applicant: Primos Storage Technology, LLC, Saratoga, CA (US)

(72) Inventor: Robert E. Cousins, Saratoga, CA (US)

(73) Assignee: Primos Storage Technology, LLC, Saratoga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/391,563

(22) Filed: Dec. 20, 2023

Related U.S. Application Data

(63) Continuation of application No. 17/683,349, filed on Feb. 28, 2022, now Pat. No. 11,901,917, which is a continuation of application No. 16/595,459, filed on Oct. 7, 2019, now Pat. No. 11,265,024, which is a continuation of application No. 15/614,608, filed on Jun. 6, 2017, now Pat. No. 10,439,654, which is a continuation of application No. 14/846,919, filed on Sep. 7, 2015, now Pat. No. 9,680,508, which is a continuation of application No. 14/051,390, filed on Oct. 10, 2013, now Pat. No. 9,128,877, which is a continuation of application No. 13/323,701, filed on Dec. 12, 2011, now Pat. No. 8,566,680, which is a continuation of application No. 12/590,040, filed on (Continued)

(51) Int. Cl.
*H03M 13/00* (2006.01)
*G06F 11/10* (2006.01)

(52) U.S. Cl.
CPC ....... *H03M 13/616* (2013.01); *G06F 11/1076* (2013.01)

(58) Field of Classification Search
None
See application file for complete search history.

(56) References Cited

U.S. PATENT DOCUMENTS

| | | | | |
|---|---|---|---|---|
| 4,937,829 A | * | 6/1990 | Kadokawa | H03M 13/151 714/757 |
| 9,419,749 B2 | * | 8/2016 | Luby | H03M 13/3761 |

(Continued)

*Primary Examiner* — Mujtaba M Chaudry
(74) *Attorney, Agent, or Firm* — Greenberg Traurig, LLP

(57) ABSTRACT

Systems and methods are disclosed for processing data. In one exemplary implementation, there is provided a method of generating H output data from W data input streams produced from input data. Moreover, the method may include generating the H discrete output data components via application of the W data inputs to one or more transforming components or processes having specified mathematic operations and/or a generator matrix functionality, wherein the W data inputs are recoverable via a recovery process capable of reproducing the W data inputs from a subset (any W members) of the H output data streams. Further exemplary implementations may comprise a transformation process that includes producing an H-sized intermediary for each of the W inputs, combining the H-sized intermediaries into an H-sized result, and processing the H-sized result into the H output data structures, groups or streams.

30 Claims, 23 Drawing Sheets

Related U.S. Application Data

Oct. 29, 2009, now Pat. No. 8,312,356, and a continuation-in-part of application No. 12/148,788, filed on Apr. 21, 2008, now Pat. No. 8,078,944.

(60) Provisional application No. 61/173,940, filed on Apr. 29, 2009, provisional application No. 61/109,493, filed on Oct. 29, 2008, provisional application No. 60/925,502, filed on Apr. 19, 2007.

(56) References Cited

U.S. PATENT DOCUMENTS

| | | | | |
|---|---|---|---|---|
| 2009/0010103 A1* | 1/2009 | Sallas | .................... | G01V 1/005 |
| | | | | 367/41 |
| 2009/0112547 A1* | 4/2009 | Matsliah | ............. | G06F 11/3608 |
| | | | | 703/13 |
| 2010/0103001 A1* | 4/2010 | Shokrollahi | ...... | H03M 13/3761 |
| | | | | 341/94 |

* cited by examiner

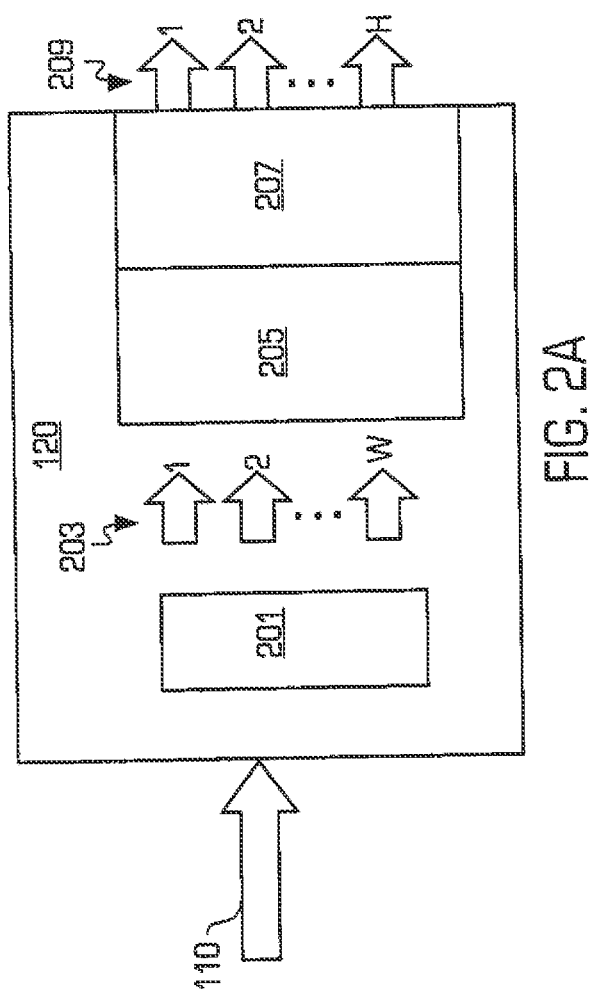

SYSTEMS, METHODS AND COMPUTER PROGRAM PRODUCTS INCLUDING FEATURES OF TRANSFORMING DATA INVOLVING A SECURE FORMAT FROM WHICH THE DATA IS RECOVERABLE

CROSS-REFERENCE TO RELATED APPLICATIONS

This is a continuation of application Ser. No. 17/683,349, filed Feb. 28, 2022, U.S. Pat. No. 11,901,917, which is a continuation of application Ser. No. 16/595,459, filed Oct. 7, 2019, now U.S. Pat. No. 11,265,024, which is a continuation of application Ser. No. 15/614,808, filed Jun. 6, 2017, U.S. Pat. No. 10,439,654, which is a continuation of application Ser. No. 14/846,919, filed Sep. 7, 2015, U.S. Pat. No. 9,680,508, which is a continuation of application Ser. No. 14/051,390, flied Oct. 10, 2013, now U.S. Pat. No. 9,128,877, which is a continuation of application Ser. No. 13/323,701, filed Dec. 12, 2011, now U.S. Pat. No. 8,568,680, which is a continuation-In-part of application Ser. No. 12/148,788, filed Apr. 21, 2008, published as US2009/0204859A1, now U.S. Pat. No. 8,078,944, which claims benefit/priority of provisional application No. 60/925,502, all of which are incorporated herein by reference in entirety; application Ser. No. 13/323,701 is also a continuation of application Ser. No. 12/590,040, which claims benefit/priority to provisional application No. 61/109,493, filed Oct. 29, 2008, and provisional application No. 61/173,940, filed Apr. 29, 2009, all of which are Incorporated herein by reference in entirety.

BACKGROUND

Field

The innovations herein relates to data processing, and, more particularly, to systems and methods consistent with creation of transformed data from plaintext input data and/or other utilizations relating to such transformation

Description of Related Information

Information including plaintext data is commonly managed using a variety of processing techniques and tools, such as components that split the information into smaller portions for easier handling, transmission and storage. Existing systems for handling and subdividing information sometimes include components that provide the ability to reformulate sub-portions into the original data even when less than all of the sub-portions are immediately available at a node where the original data is desired. However, such systems generally facilitate only limited ability to recover data when loss occurs. They are unable to create or utilize additional streams or pieces of media containing redundant data to aid in future recovery.

Other existing systems may include components that manage information including plaintext data. Such systems generally store, handle or transmit the original information in a manner where the plaintext data is readily available to those with access to the system. A drawback of these systems is that they typically possess little or no means to protect underlying plaintext from unauthorized or undesired viewing, and thus the plaintext is often exposed to undesirable situations or individuals.

In sum, there is a need for systems and methods that may advantageously process plaintext data by, for example, performing transformation and related processes that provide redundancy safeguards, enable protection of the original plaintext data, or impart other advantages.

SUMMARY

Systems, methods, and articles of manufacture consistent with the invention are directed to transformation of input data including plaintext into output data and/or other utilizations relating to transformation components/processes or the transformed data itself.

In one exemplary embodiment, there is provided a method of processing data from input data that includes plaintext. Moreover, the method includes producing a first quantity of data inputs (W) from the input data, and generating a second quantity (H) of output data streams from the first quantity of data inputs via application of the data inputs to one or more transforming components that perform a transformation process using Galois field operations and a generator matrix characterized as being invertible in all subsets encounterable during later recovery of the input data. According to aspects of the innovations herein, the second quantity (H) of data output streams may be greater than (or greater than or equal to) the first quantity (W) of data inputs, and the transformation process may include, for each of the W inputs, producing an H-sized intermediary, combining all H-sized intermediaries into one H-sized result, and processing the one H-sized result into the H discrete output data streams. In one or more implementations, the W data inputs are recoverable via a recovery process capable of producing the W data inputs from any W members of the H output data streams. This recovery process is analogous to the original transformation process.

It is to be understood that both the foregoing general description and the following detailed description are exemplary and explanatory only and are not restrictive of the invention, as described. Further features and/or variations may be provided in addition to those set forth herein. For example, the innovations herein may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various embodiments and aspects of the innovations herein and, together with the description, explain the principles of the invention. In the drawings:

FIGS. 2A-2B are block diagrams illustrating exemplary transformation components consistent with certain aspects related to the innovations herein;

DETAILED DESCRIPTION

Reference will now be made in detail to the invention, examples of which are illustrated in the accompanying drawings. The implementations set forth in the following description do not represent all implementations consistent with the claimed inventions.

Instead, they are merely some examples consistent with certain aspects related to the invention. Wherever possible, the same reference numbers will be used throughout the drawings to refer to the same or like parts.

Many systems and environments are used to store, package, and/or transmit information, such as information containing sensitive plaintext data, via techniques that transform or subdivide original streams of information. Examples of such system and environments are disk arrays, backup systems, networking devices, add-in cards, applications programs, libraries, and/or shared object or operating system modules, in addition to many others. These systems and environments can be implemented using a variety of components, including via software components, hardware components, and/or hybrids thereof.

Systems, methods, articles of manufacture, components and/or subcomponents consistent with aspects of the innovations herein relate to creating one or more derived data streams from an input data stream such that the original data is no longer in the transformed data or data stream (in plaintext) while having sufficient redundancy to recover the original data stream. Additionally, according to other aspects, original data or plaintext may be maintained along with the transformed data while maintaining certain features of redundancy, recovery, and/or other innovations herein.

Figure 1:
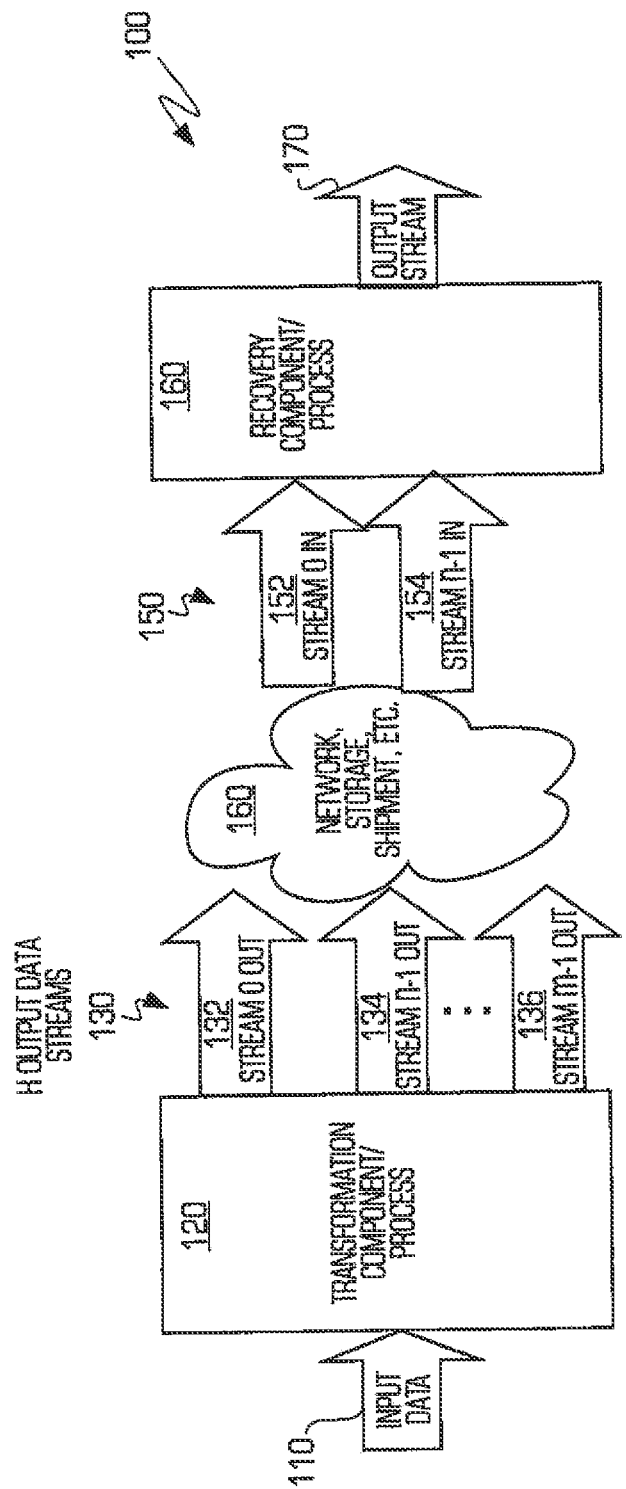
FIG. 1 is a block diagram of an exemplary system and/or method consistent with certain aspects related to the innovations herein.

FIG. 1 illustrates a block diagram of an exemplary environment (system or method) 100 consistent with certain aspects related to the innovations herein. Referring to FIG. 1, environment 100 may comprise a transformation component/process 120, shown generally here, that receives input data 110, which may also include plaintext data. Via any of the variety of circuitry, components or processes set forth below, transformation component/process 120 generates a quantity (H) of output data streams consistent with one or more of the features and/or advantages herein. According to certain further implementations, information in the H output data streams 132, 134, 136 may also be handled or utilized in a variety of additional implementations 160, such as in transmission over a network, storage, shipment, etc., in connection with achieving the innovations herein. When recovery of the original data or plaintext is desired, a plurality of output data streams 150, which may be a set of streams 152, 154 less than H, are sent to a recovery component/process 165 to generate the desired output stream 170 (e.g., corresponding to the original input data 110). In other words, only W (W≤H) of these streams, fides, etc. are required by the recovery component/process 160 to reconstruct the input stream or data file. Thus, H-W data files or streams might be lost/destroyed/corrupted yet the original data is still trivially recoverable. However, if fewer than W files are available, then none of the original input data is available or recoverable. Further, since the intermediate streams/files do not contain any of the plaintext of the input, not even small portions of the input can be recovered if fewer than W pieces are available.

According to certain aspects of the innovations herein, transformation component/process 120 uses finite field and/or Galois field operations (see, e.g., http://en.wikipedia.org/wiki/Finite field arithmetic; http://en.wikipedia.org/wiki/Galois field; James S. Plank, "A Tutorial on Reed-Solomon Coding for Fault-Tolerance in RAID-like Systems", Software—Practice & Experience, 27(9), September, 1997; James S. Plank and Ying Ding, "Note: Correction to the 1997 Tutorial n Reed-Solomon Coding." *Software, Practice & Experience*, Volume 35, Issue 2, February, 2005, pp. 189-194.) and a generator matrix to transform the input data 110 into the H output data streams 130. Further, as set forth throughout, the transformation component/process may create and use a variety of intermediary data elements in the process of generating the H output data streams.

While some exemplary disclosure herein is described in the context of all streams being created simultaneously, the streams may also be created individually or in groups. 'Stream' refers to an input file, output file, sequence of bytes or other source of data such as a buffer, socket, pipe, raw storage device or other source of digital data.

In the exemplary implementation illustrated in FIG. 2A, a system that processes data consistent with aspects of the innovations herein may comprise a processing component 201 that produces a first quantity (W) of intermediate streams or "data inputs" 203 from the input data, one or more transforming components 205 that perform a transformation process on the W data inputs using Galois field operations and a generator matrix characterized as being invertible in all subsets encounterable in an associated recovery process of the input data, and a generating component 207 that generates a second quantity (H) of output data streams from the W data inputs. (Details of the recovery process and associated recovery matrix are set forth below.) In one exemplary implementation, the transformation process may also include: for each of the W inputs, producing an H-sized intermediary; combining all H-sized intermediaries into one H-sized result; and processing the one H-sized result into the H output data streams, wherein none of the H output data streams corresponds to any W data input plaintext. Other aspect may be implemented via the transformation process. For example, rows of the generator matrix may be rearranged to further scramble the input data, wherein information regarding the rearranged rows may then serve as a cryptography key.

The processing, transforming and generating components may be unitary, discrete, or distributed components. Additionally, the quantity H is greater than W, or it is greater than or equal to W, with certain distinct features and/or advantages applicable to both of these disparate aspects of the innovations herein. For example, while there is no ability to recover from a lost stream when H=W, aspects where these values are equal impart advantages consistent with data being smeared so as to obfuscate the original input data may be achieved. Further, the transformation process may include:

- for each of the W inputs, producing an H-sized intermediary;
- combining all H-sized intermediaries into one H-sized result and
- processing the one H-sized result into the H output data streams.

Due to the redundancy set forth herein, the W data inputs are recoverable via a recovery process capable of reproducing the W data inputs from any subset of the H output data streams with cardinality W.

In another exemplary implementation, a method of processing data consistent with aspects of the innovations herein may include producing a first quantity (W) of data inputs from the input data, and generating a second quantity (H) of output data streams from the first quantity of data inputs via application of the data inputs to one or more transforming components that perform a transformation process using Galois field operations and a generator matrix characterized as being invertible in all subsets encounterable during later recovery of the input data. According to aspects of the innovations herein, the quantity of H data output streams may be greater than (or greater than or equal to) the quantity W of data inputs, and the transformation process may include: for each of the W inputs, producing an H-sized intermediary; combining all H-sized intermediaries into one H-sized result; and processing the one H-sized result into the H discrete output data streams. In one or more implementations, the W data inputs are recoverable via a recovery process capable of producing the W data inputs from any W members of the H output data streams.

According to these features, the loss of one or more data streams is not a hindrance to the recovery of data, yet there is a threshold minimum number of streams required to recreate the original data. As such, aspects of the innovations herein may include certain innovations in some situations. For example, where data is large enough to be spread across multiple pieces of media (by necessity or convenience), the ability to create additional pieces of media with additional redundant data to aid in future recovery can be a major benefit. That the original content is not on any piece of media may also be advantageous. The fact that a threshold of pieces of media are required is also advantageous. Additionally, where there is a duty or desire to maintain confidentiality, the fact that the plaintext is not present may be advantageous. And the threshold number of pieces of media to recover is also advantageous. Finally, where there is risk of data loss due to corruption or media failures, certain advantages may be achieved, as set forth below.

Aspects consistent with the inventions and/or innovations herein may be implemented in a number of technologies, using a variety of components, such as one or more hardware components (see, inter alia, FIGS. 2A-2B, etc.), one or more software components (see, inter alia, FIGS. 3A-3C, etc.) or hybrids thereof, for example, via: disk arrays, backup systems (using almost any type of media imaginable), networking devices (which may split and/or join data streams as applicable or required), add-in cards, applications programs, libraries, and/or shared object or operating system modules, in addition to having many other applications. Aspects may use base 4, 8, 16, 32 or any other base for calculations. Optionally, it could include compression and/or encryption. Finally, the streams themselves may include error detecting and/or correcting redundancy to help cope with corruption and erasures.

Figure 2B:
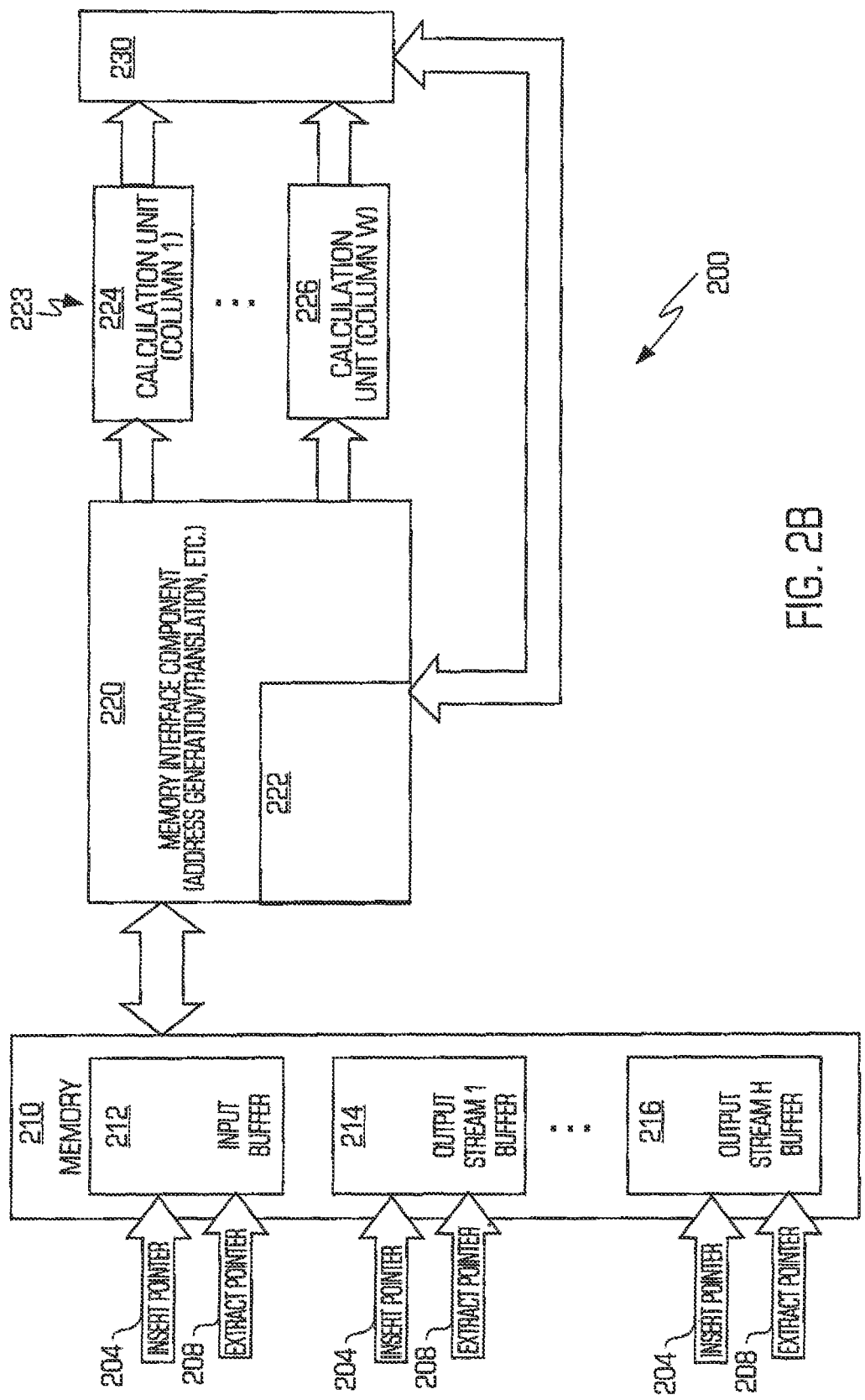

FIG. 2B is a block diagram illustrating exemplary transformation components consistent with certain aspects related to the innovations herein. As shown in FIG. 2B, exemplary transforming components 200 include a memory 210, a memory interface component 220, calculation components or subcomponents 223, and a summing or combining component 230. According to certain implementations, memory 210 may be used to buffer various data streams. For example, FIG. 2B illustrates a first region 212 used to buffer the input stream, as well as a series of buffers 214, 216 used to buffer the first through H output streams. Management of the memory 210 may be achieved via a memory interface component 220, which performs task such as address generation, address translation, etc. Memory interface component 220 may also include a state management subcomponent 222 that handles the various pointers, counters and other state-related indicia and processes for buffer management. For example, insert pointers 204 and extract pointers 208 exist as state within state management subcomponent 222. Further, depending upon its 'packaging' logic, the state management subcomponent 222 may be configured to manage processing for transformation and recovery (also referred to as encoding and decoding), or for use in network environments (datagram processing/transmission), application level processing, or even for storage. Further, calculation components/subcomponents 223, such as calculation units 224, 226, may be implemented using RAM for lookup, PLA, discrete logic, or other similar technologies.

Figure 3A:
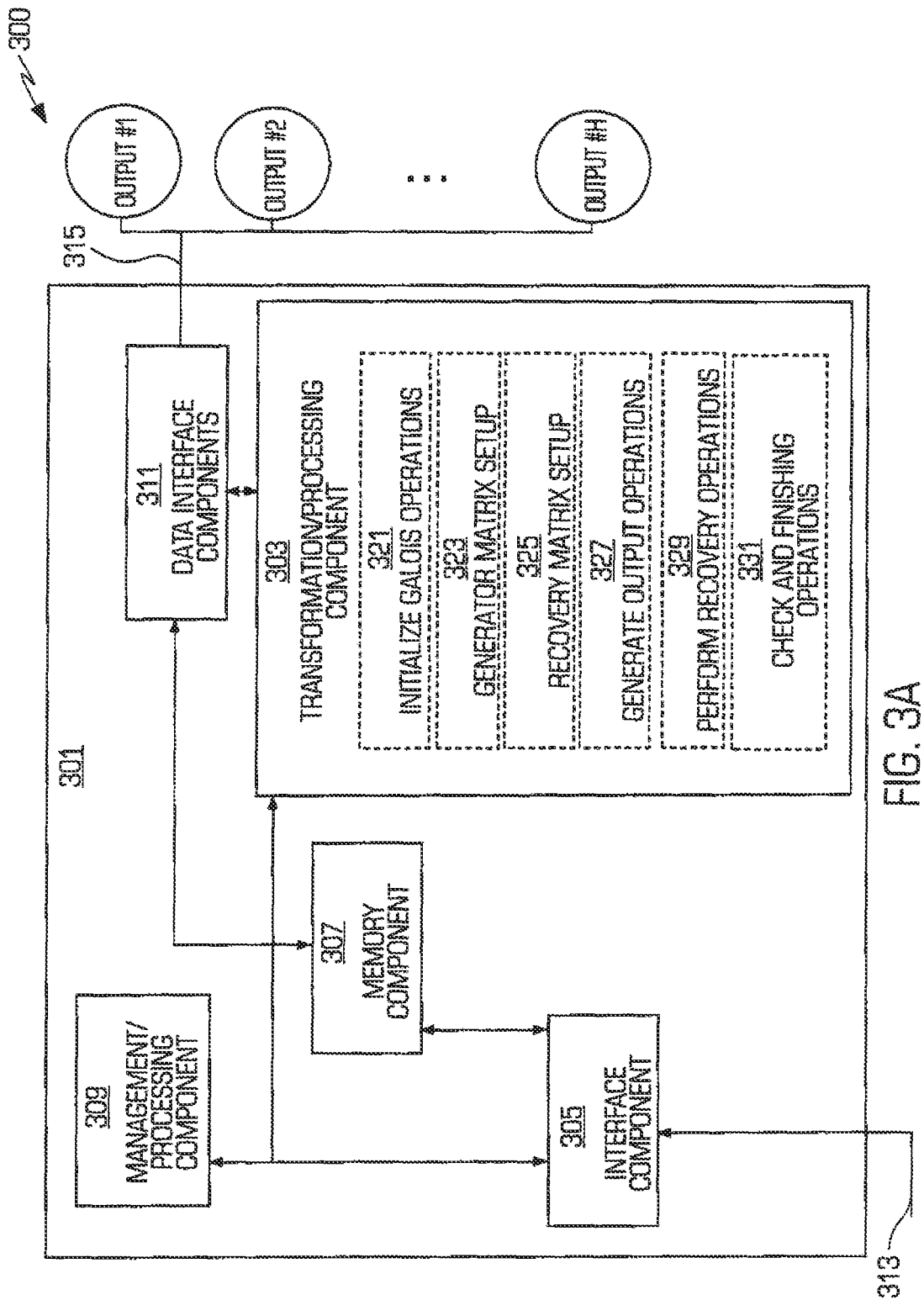
FIGS. 3A-3C are diagrams illustrating exemplary transformation processing routines and processes consistent with certain aspects related to the innovations herein.
Figure 3B:
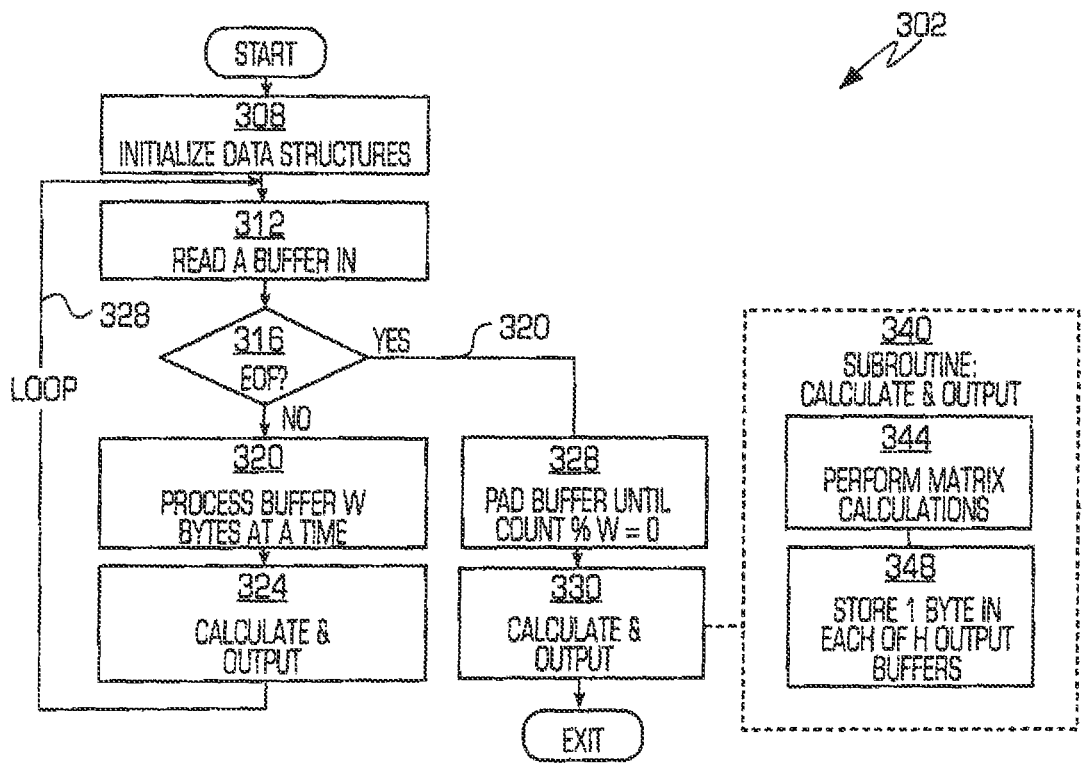
Figure 3C:
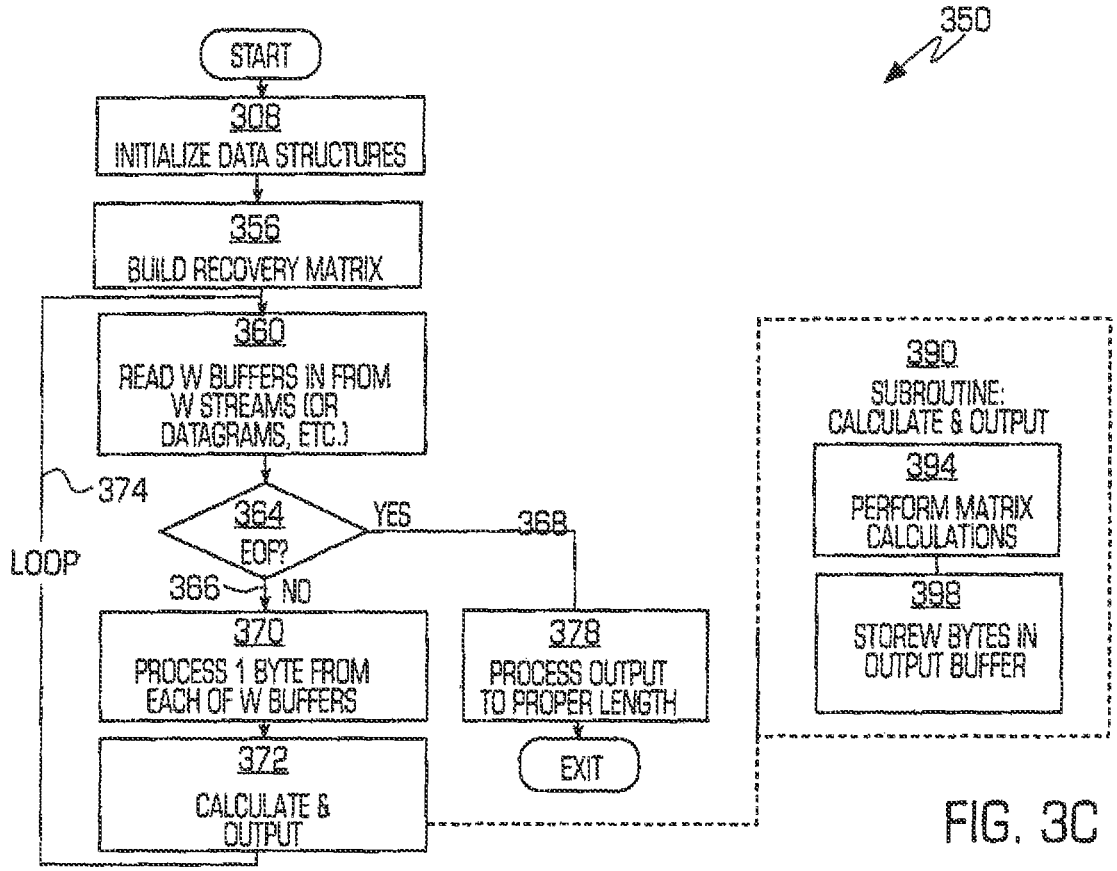

FIGS. 3A-3C are diagrams illustrating exemplary transformation processing routines and processes consistent with certain aspects related to the innovations herein. As shown in FIG. 3A, an exemplary transformation component 301 (e.g., software routine, etc.) may include an interface component that handles input data 313 and related data transfer and communication, a memory component 307 that that controls memory access functionality, a management/processing component 309 for management and/or central processing operations, one or more output data interface components 311, as well as one or more transformation/processing components 303 which may, e.g., perform the primary computational functionality of the transformation component 301 or routine. According to one illustrative implementation, for example, transformation/processing component 303 may include: an initialize Galois operations 321 (see Appendix A, e.g., gal test) subcomponent or routine that performs Galois testing operations such as initializing the Galois tables, building up associated multiplication tables and verifying their correctness, implementing log tables, and performing multiplications and divisions thereof (though not strictly required, are a useful performance enhancement for use in many implementations); generator matrix setup operations 323 (initialize A) subcomponent that builds the relevant generator matrix such as a Vandermonde matrix, and initializes the generator matrix as well as inputs thereto; one or more recovery matrix setup 325 (fail_rows, invert_B, fail_data) subcomponents that performs various recovery or decoding setup processes such as randomly selecting rows to be used in the recovery matrix, and copying the rows thereto, as well as creating the recovery matrix itself; a generate output operations 327 (multiply_ADE) subcomponent that takes the input matrix and multiplies it by the generator matrix to obtain the final (E) matrix output yielding the H output data streams; a perform recovery operations 329 (rnultiply_BFQ) subcomponent that multiplies the transformed data by the recovery matrix to produce the original input data and/or plaintext; and one or more check and finish operations 331 (check_result, initialize_D) including, for example, processes to verify that the results are consistent with the input data as well as processes to confirm that all of the row and column operations are finished so as to verify completion. See, for example, Appendix A, submitted herewith, as well as all of the Appendix materials submitted herewith, which are incorporated by reference in their entirety. Such subcomponents 321, 323, 325, 327, 329, 331 are shown for purpose of illustration not limitation, and may be otherwise organized, combined and/or distributed as with like routines to achieve the innovations herein.

Referring to FIG. 3B, an exemplary transformation processing, or encoding, procedure consistent with certain aspects related to the innovations herein is shown. FIG. 3B is a diagram illustrating one exemplary process 302 of encoding an input stream by first initializing data structures 308, then taking the input stream and splitting it into groups of length W, then performing matrix calculation (e.g., multiplying it by the generator matrix) to yield an output vector of length H, where each member of the output is then output to a different output stream 348. According to the exemplary process of FIG. 3B, data structures are first initialized 308. Then, for each input stream or file, exemplary process 302 executes a loop 312, 320, 324, 328 until the end of the stream or file is reached. The loop may include reading a buffer in 312, checking for end of file 316, and, if it's not the end of the file, processing the buffer W bytes at a time and performing a calculate and output subroutine for each portion processed. At the completion of each calculate and output subroutine, the procedure loops to the read step 312 to read in the next buffer portion 312. Once the end of the particular stream or file is reached 320, output buffer is padded until count percentage W drops to zero 328. At this time, a second calculate and output 330 subroutine may be performed to generate the H output data streams. In one exemplary implementation 340 of the second calculate and output subroutine, matrix calculations are performed 344 on the intermediary information and the resulting portions of the transformed information (1 byte, in this example) are stored in each of the H output buffers 348.

FIG. 3C shows steps associated with an exemplary recovery, or decoding, procedure complementary to the encoding procedure of FIG. 3B. In FIG. 3C, given W input streams (from a set of all H streams), the recovery matrix is created 356 by copying the lines from the generator matrix which correspond to the surviving W streams. This subroutine 356 may also include selecting generator matrix rows, inverting the matrix, and calculating preparations required for the 'calculate and output' subroutine. Next, this matrix is inverted using finite field and/or Galois arithmetic operations. Then, each of the W streams is read in turn 360 (in order of their lines in the recovery matrix) via a loop 360, 370, 372, 374 similar to FIG. 3B until an end of file or stream is reached 368 and a W width vector is created. The loop may include a calculate and output subroutine 372, 390 comprised of performing matrix calculations 394 and storing W bytes in the output buffer 398. Next, the W width vector is multiplied by the recovery matrix using Galois arithmetic and then processed 378 (e.g., truncated, etc.) to the proper size and length. The ensuing W width results correspond to the next W entries of the original output. (It should be noted that the original input may also be padded with up to W−1 extra entries via this process.)

Figure 4A:
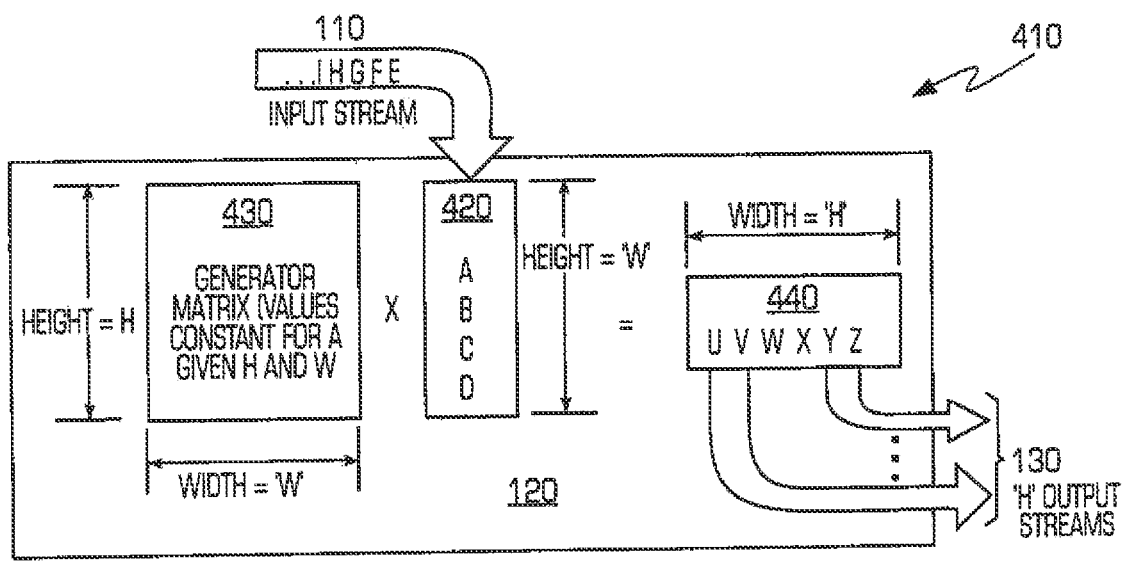
FIGS. 4A-4B are a logic/flow diagrams illustrating exemplary processes of transforming input data into H output data streams consistent with certain aspects related to the innovations herein.
Figure 4B:
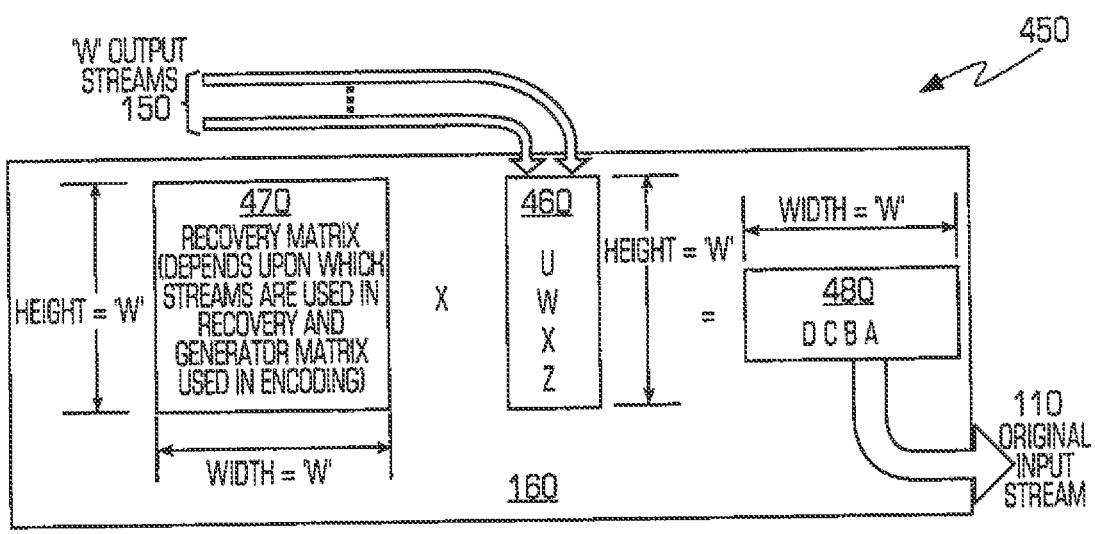

FIGS. 4A-4B are a logic/flow diagrams illustrating exemplary processes of transforming and recovering input data to and from H output data streams consistent with certain aspects related to the innovations herein. The transformation process 410 of FIG. 4A shows crossing (multiplying) portions 420 of the input stream 110 with the generator matrix 430 to produce intermediary results 440 of width H, which are then processed into the H output data streams 130. The recovery process 450 of FIG. 4B shows crossing (multiplication) of the recovery matrix 470 with portions 460 of the W output streams 150 used to decode. Again, intermediary results 480 of width W are obtained, which are then processed into the original input stream 110. In exemplary encoding and decoding processes such as these, the matrix operations may be performed according to finite field rules for suitable generator polynomials of given base (such as base 8, etc.).

Figure 5A:
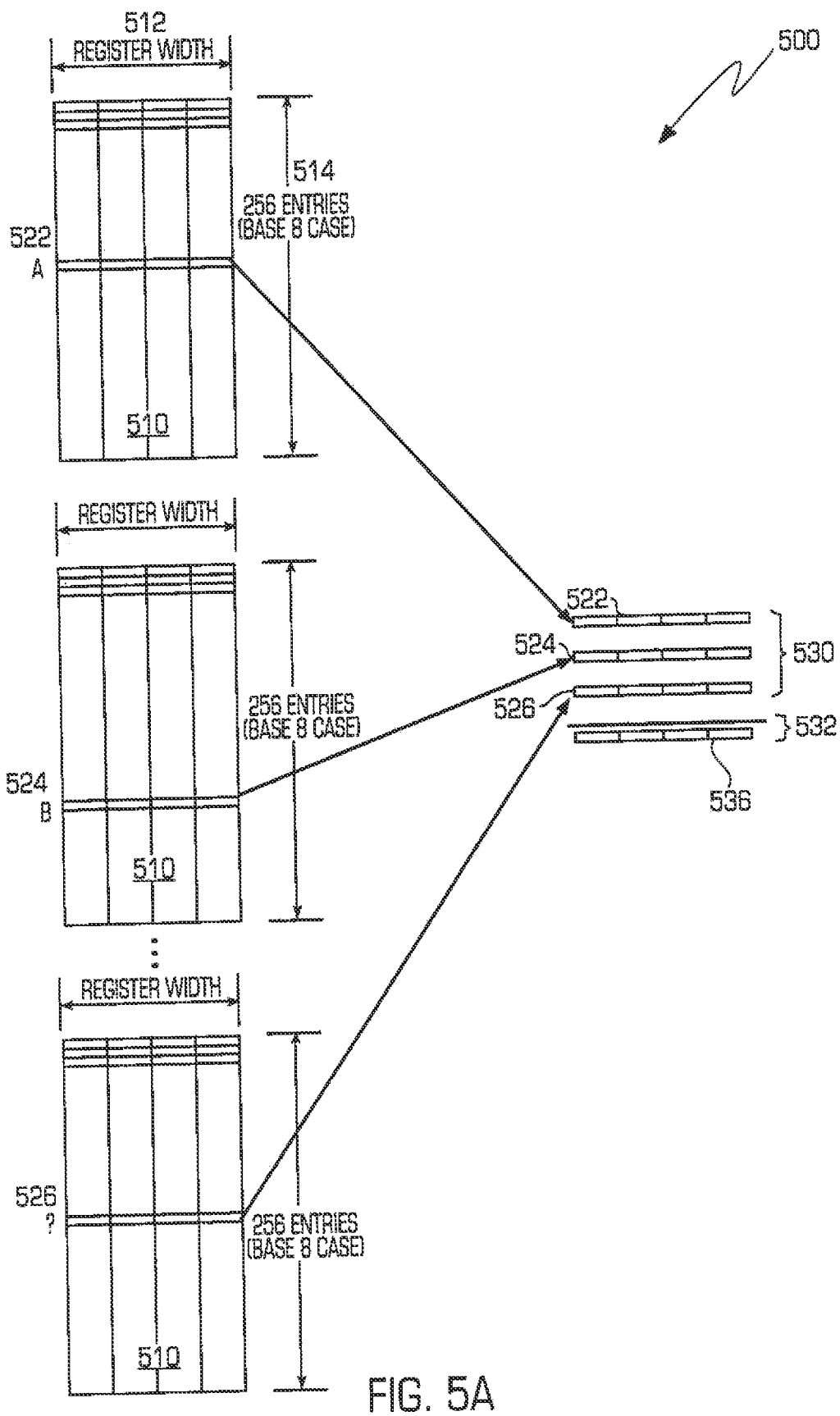
FIGS. 5A-5B are logic/flow diagrams illustrating generator/recovery matrix-related functionality consistent with certain aspects related to the innovations herein.
Figure 5B:
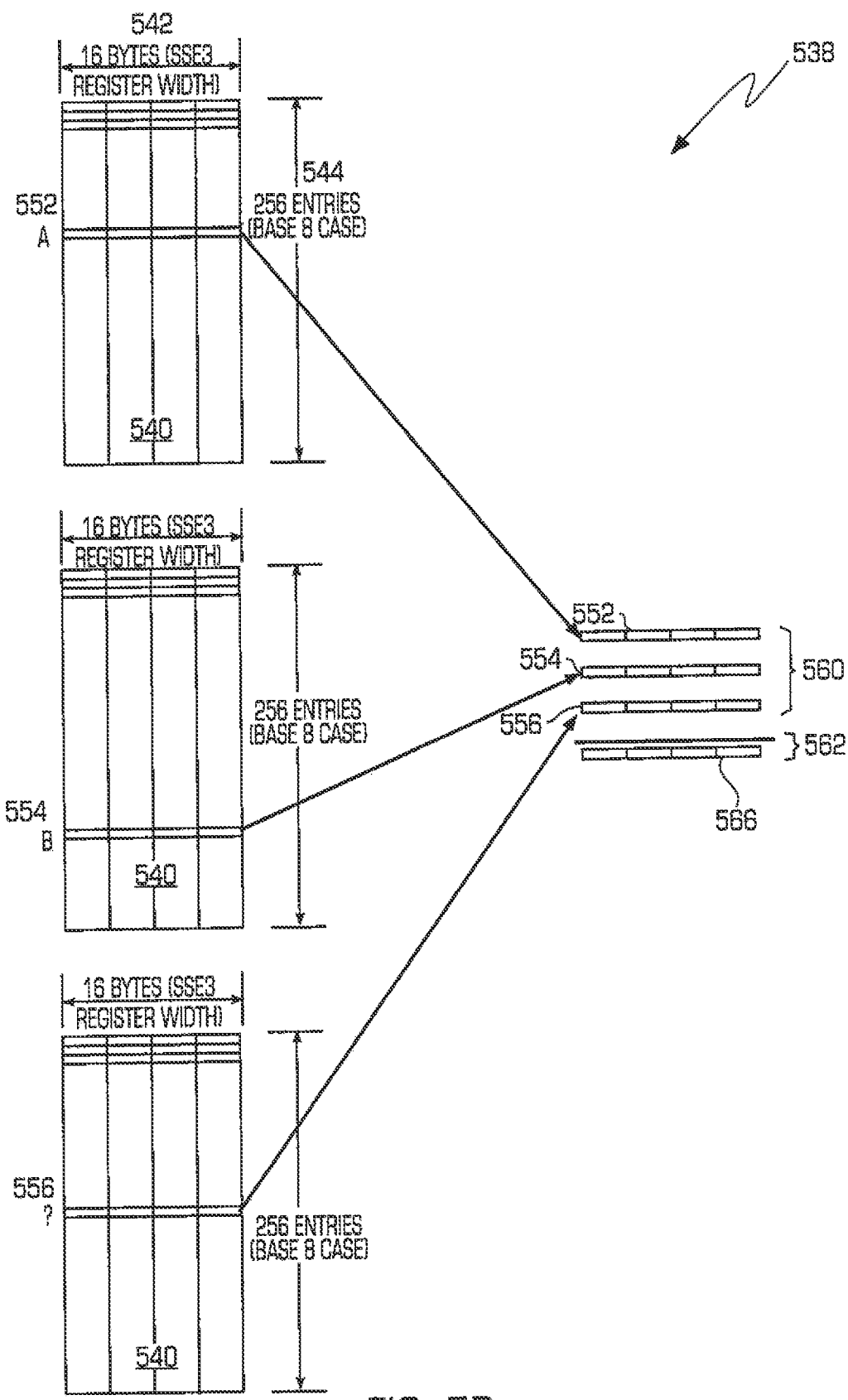

FIGS. 5A-5B are logic/flow diagrams illustrating generator/recovery matrix functionality consistent with certain aspects related to the innovations herein. Referring to FIG. 5A, certain matrix-based functionality, which may be implemented in pure software, is shown. FIG. 5A shows tables 540, which may be calculated by the transformation component, for lookup of multiplication results based on the generator/recovery matrix. Here, for example, each byte lane would contain a table 540 having a width 512 equal to the register width and a height 514 commensurate with the base value (e.g., 256 entries in height for base 8 calculations), where the table is used to look up multiplication by constant from the matrix. Calculation of such tables 540 enables evaluation of an entire column of a generator or recovery matrix by a single table lookup. Further, by merging multiplication by constant tables, 4 or more rows may be calculated at once. To produce an output 536, desired rows 522, 524, 526, etc. may be joined via a finite field or Galois add operation such as XOR (exclusive OR) to yield a sum 532 providing the output 536.

Referring to FIG. 5B, certain matrix-based functionality, which may be implemented in software plus special purpose (SIMD) instructions, is shown. For purposes of illustration, the example of FIG. 5B assumes SSE3 instructions, though the innovations herein are not limited to any one type of such instructions. Similar to FIG. 5A, FIG. 5B shows tables 540, which may be calculated by the transformation component, for lookup of multiplication results based on the generator/recovery matrix. Here, for example, each byte lane would contain a table 540 having a width 542 of 16 bytes (i.e., SSE3 register width) and a height 544 commensurate with the base value (e.g., 256 entries in height for base 8 calculations), where the table is used to look up multiplication by constant from the matrix. Calculation of such tables 540 enables evaluation of an entire column of a generator or recovery matrix by table lookup. Further, by merging multiplication by constant tables, in the case of SSE3, 16 rows may be calculated at once. To produce an output 566, desired rows 552, 554, 556, etc. may be joined via a finite field or Galois add operation such as XOR (exclusive OR) to yield a sum 562 providing the output 566.

Figure 6A:
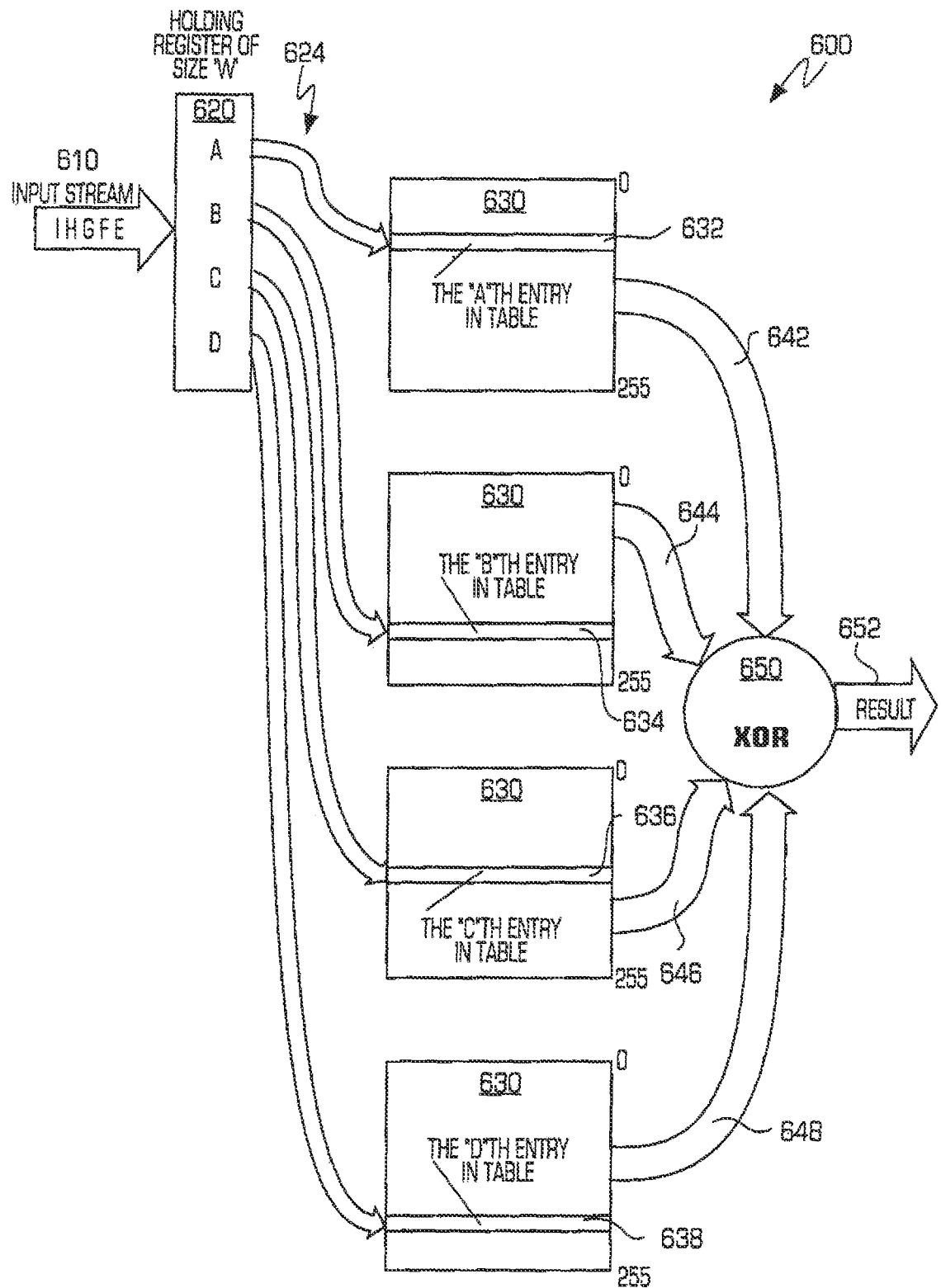
FIGS. 6A-6B are logic/flow diagrams illustrating recovery matrix-related functionality consistent with certain aspects related to the innovations herein.

Referring to FIG. 6A, certain matrix-based functionality, which may be implemented in hardware, is shown. FIG. 6A shows exemplary encoding or decoding systems including various components or devices that may implement one or more of the transformation processes set forth herein. Here, for example, a register 620 of size W is used to hold the input stream for processing with the encoding/decoding table values. According to certain implementations, the tables values would be constant for a given W and H for encoding, while, for decoding, the table values would vary depending upon W, H, and which streams were used for recovery. In this example, the lookup tables 630 may be stored in one or more memory devices initialized to width H*2**base and height, or $2^{base}$, i.e., in common cases, 128 bits wide by 256 entries. As such, the values A, B, C, D from the register 620 are crossed (multiplied) with corresponding entries from the tables 630 to yield intermediary results 642, 644, 646, 646. These multiplications can take place concurrently (for maximum speed), sequentially (for minimum hardware) or in any combination in between. These intermediary results, in turn, are summed 650 (XORed) to produce the final desired result/output 652.

Figure 6B:
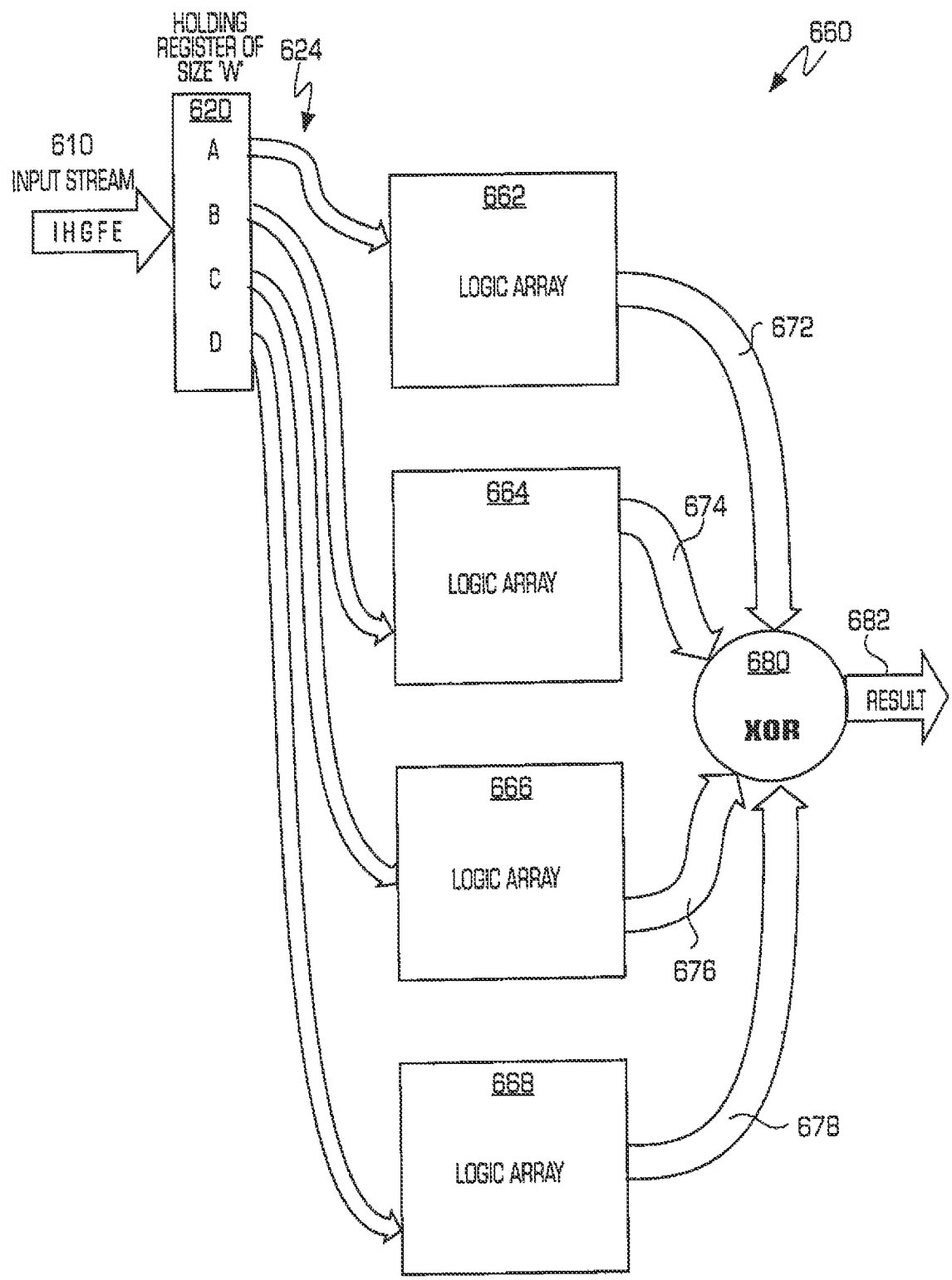

FIG. 6B illustrates further matrix-based functionality, which may also be implemented in hardware. The implementation of FIG. 6B utilizes a register 620 and input stream 610 processing to determine input values 624 for mapping consistent with the example of FIG. 6A. The implementation of FIG. 6B, however, includes a series of arrays 662, 664, 666, 668, which may be discrete circuitry, state machines, logic arrays, PLAs, or the equivalent, and which translate the given input values 624 into the intermediary output results 672, 674, 676, 678. Lastly, the intermediary results are again summed (XORed) to produce the final output result 682 of the component in question.

Figure 7:
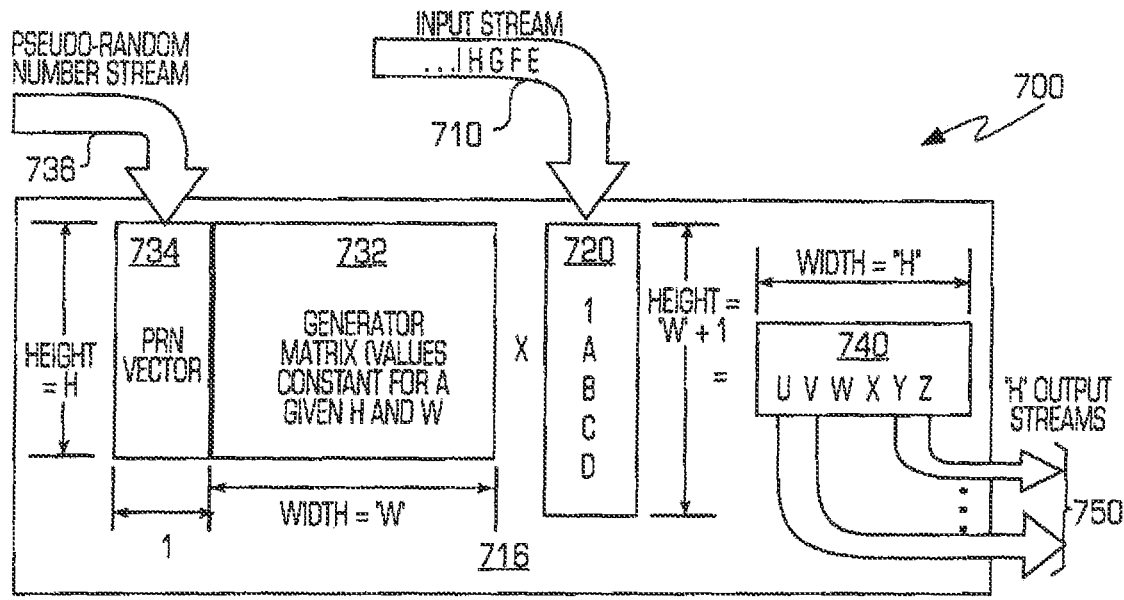
FIG. 7 is a logic/flow diagram illustrating additional generator/recovery matrix-related functionality consistent with certain aspects of the innovations herein.

FIG. 7 is a diagram illustrating additional generator/recovery matrix-related functionality, including integration of a random data component to provide encryption, consistent with certain aspects of the innovations herein. The logic/flow diagram 700 of FIG. 7, in general, includes input stream 710, portions 720 thereof, a generator or recovery matrix 732, intermediary results 740, and output 750 features consistent with those of FIGS. 4A-4B. Further, diagram 700 also illustrates an exemplary application of pseudo-random data 736 into the matrix operations to provide for encryption of the output stream 750. In the exemplary encryption scheme illustrated, the pseudo-random data 736 is processed into a vector component 734 for integration into the transformation process to produce the encrypted output 750. Another application of a pseudo-random data is in the selection of the rows of the generator matrix to use to produce a given set of streams. Other applications of pseudo-random data 736 include application of pseudo-random data to the H-sized intermediaries or the H-sized result via an exclusive OR operation to provide encryption to the H output data streams.

Networking

The present innovations having provide particularized benefits in various networking systems and methods. First implementations in this regard relate to moving large files, such as when transferring files from facilities having several independent network connections. According to aspects of the innovations herein, multiple data transfers may be created (either concurrently or sequentially) which can be combined at the receiving end. The net result is shorter time to transfer the data than would normally be required by using a single connection. Additionally, the resulting data would be more likely to be correct given the higher reliability of the recovery mechanism and in fact would provide correct data even when a subset of connections have failed. Further, if more than one network connection is available, this technique allows all connections to be used concurrently for additional throughput.

Figure 8:
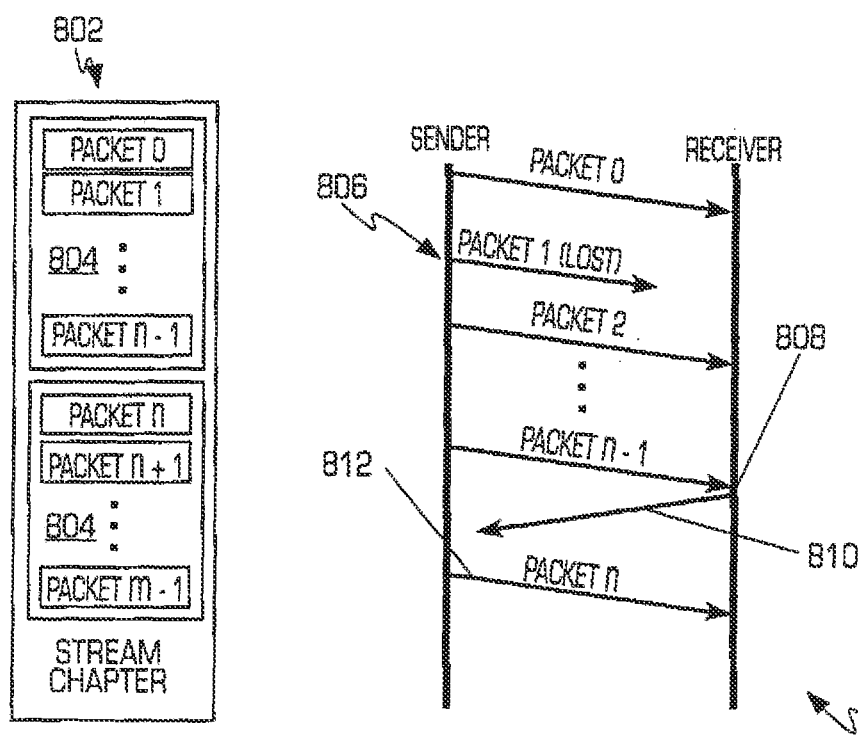
FIG. 8 is diagram illustrating exemplary packet transmission functionality consistent with certain aspects related to the innovations herein.

Additional network implementations relate to new networking protocols. Existing protocols, such as TCP, suffer from a variety of well known drawbacks, and most alternatives to TCP are based upon the idea of sending data more quickly and using more resources at each end. In contrast, systems and methods of present disclosure may include innovations consistent with a new approach to data movement: the use of data correction in the face of dropped packets. According to some aspects of these innovations, an input stream may be divided into segments, for example, 128 datagrams. A sender may then use innovations herein to calculate 256 new datagrams (W=128, H=256). As illustrated in FIG. 8, the sender then begins sending the first 128 of the new datagrams. Once this segment 804 of the data stream 802 is transmitted, the sender begins to transmit the subsequent segment 804 made up from the next group of 128 datagrams. When the receiver notices the transition from one segment to the next, it counts the valid datagrams in each segment. If a segment has the proper number of datagrams, then the data is recovered and the receiver acknowledges (either explicitly or implicitly) the correct transfer of the segment. If one or more datagrams are corrupted or missing 806, the receiver cannot reconstruct the input stream when it attempts recovery because of the lost or corrupted packet. Here, the receiver typically times out or sends information back to the sender that a number of packets are missing. The receiver may inform the sender either explicitly or implicitly, (Explicitly would involve the receiver informing the sender that it needs x additional datagrams. Implicitly could involve a timeout whereby the sender will automatically send an additional datagram after a period of time without an acknowledgement.) As such, sender sends an additional redundant packet which allows reconstruction of all original data from packets 0 through H−1. Eventually, the sender will send enough datagrams to recreate the entire segment. If necessary, the sender can wrap around and resend packets or the sender can generate additional datagrams. Optionally, the sender can then include additional datagrams automatically with each segment to compensate for anticipated data loss or corruption. This amount can be dynamically altered for optimal reliability and/or throughput.

Systems, methods and components consistent with this approach enable the sender to push the network's capacity to the limit such that any additional load will result in substantial packet loss. (The overhead of sending one additional datagram out of say 128 is tiny, yet it makes it possible for the sender to operate extremely close to capacity.) These systems, methods and components may include one or more advantages wherein, for example: (1) the plaintext of the messages is never transmitted, (2) the loss of an arbitrary number of packets (up to H-W) will not result in lost of data, (3) the amount of traffic from the receiver to the sender is very small (i.e., much less than TCP), (4) more effective operation where data loss rates are zero, very low or very high (>50%), and/or (5) the transmission of one group of W packets may overlap with the correction of previous groups of packets (therefore allowing the sender to continuously send and the receiver to continuously receive without the need for a pause and a round-trip delay).

When used in a multicast situation, the receiving nodes may bid for additional datagrams in an auction whereby each node listens and 'bids' Its required number of datagrams if larger than the current bid. Some nodes may then discard unneeded datagrams while other nodes may need all datagrams.

File System, Disk Controller or Driver Components

Figure 9:
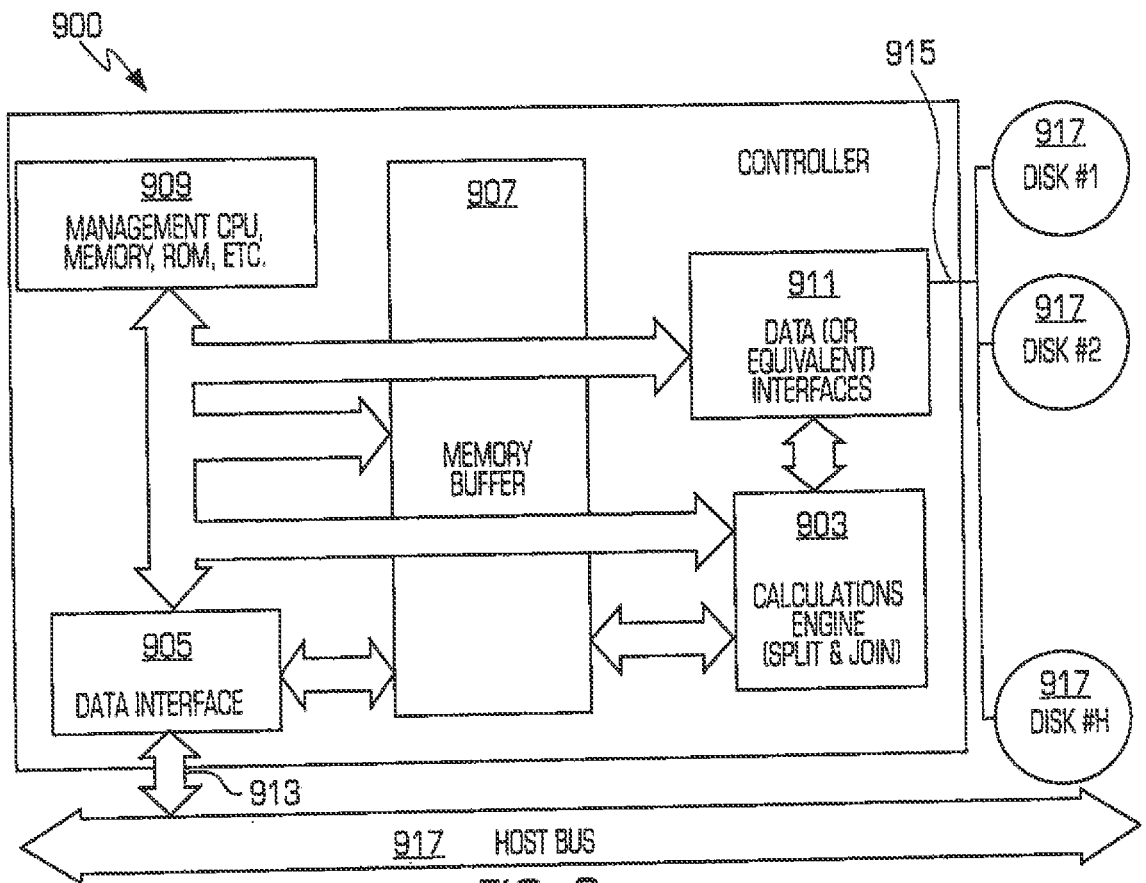
FIG. 9 is a block diagram illustrating an exemplary implementation involving disk storage of the output data streams consistent with certain aspects related to the innovations herein.

According to one or more further aspects of the innovations herein, data store or disk arrays are provided in which no plaintext is stored yet the array can survive the destruction of an arbitrary number of disks or devices. In this regard, FIG. 9 is a block diagram illustrating an exemplary implementation involving disk storage of the output data streams consistent with certain aspects related to the innovations herein. System 900 of FIG. 9 may includes a main processing component 901 that receives input data 913 via a data interface 905, such as data from over a host bus 917. The main processing component 901 may also include a memory buffer 907, a management/processing component 909 for management and/or central processing operations, one or more output data interface components 911, as well as one or more transformation/processing components 903 which may, e.g., perform the primary computational functionality of the main processing component 901. According to one exemplary implementation, for example, the transformation/processing component 903 may perform the finite filed/Galois operations and matrix manipulation features and functionality set forth herein. Further, then, data transformed by component 903 may be sent to one or more data interfaces 911, which provide H output data streams to H disks 917, storage devices, etc.

Another variant, here, is an implementation using both disks and remote storage devices (either over a SAN, LAN or the internet for example). In the extreme case, several storage devices could be placed around the internet (perhaps in different countries for various legal or logistical reasons). In one more general implementation, H output data streams may be stored in disparate data stores, wherein no single data store contains output streams sufficient to recover the input data, such that the destruction of or loss of connectivity to or otherwise unavailability any quantity of the data stores from 1 through H-W does not impede the ability to recover the stored data. As such, a client is required to access a minimum subset of the disks and/or devices to recover the original/plaintext data. Moreover, the transformed data may be regenerated by accessing at least W of the H output data streams, without revelation of the plaintext. For reasons consistent with the regulations (privacy, trademark, etc.) discussed herein, especially those providing restriction in only one nation or region, the disparate data stores may be located in different and/or multiple jurisdictions, different and/or multiple countries, areas without established or dearly agreed upon jurisdiction or governmental control.

Further, aspects of the innovations herein have particularized benefit with regard to storing data that is backup data, historical data and/or archival data. And similar benefits also apply to the transformation and storage of data covered by a heightened duty or privilege such as medical information, accounting information, attorney-client privileged information, email, personnel files, content declared classified, thereby requiring storage which is both safer from disaster than normal and also more difficult to be disclosed to third parties. The communication to/from these remote stores could be via a file-level protocol such as FTP, SFTP, NFS, CIFS, an object-level protocol or a block-level protocol such as iSCSI, or NetDisk. Furthermore, such information could be locally cached, encrypted, compressed as desired for additional value.

One advantage to the above is that the physical theft of devices would not result in loss of data or ability to recover sensitive data by a malicious party. Indeed, there are a number of substantive regulations around the globe, both existing and proposed, which cover protection of plaintext confidential data. This technology overcomes numerous drawbacks associated with existing systems and methods that fall short of addressing the technological issues behind these regulations.

According to alternate aspects, a kernel module, SAN device, iSCSI device or a physical disk controller may be implemented to embody the innovations, here. While the overhead would be substantial, it enables one to insert/remove disks at will, with certain limited restrictions. (See U.S. Pat. No. 7,386,663 B2, U.S. Pat. No. 6,671,772 B1 and continuations for example applications.)

Similarly, these aspects may also be implemented as a tape (or other storage medium) controller and/or driver. In the case of a backup controller, the output would be H pieces of media of which only W are required for recovery. And because backups are often faulty, typically due to error-laden media, aspects of the innovations herein overcome the drawbacks of existing backup technologies when H>>W is used.

In another exemplary aspect, the above controller is teamed with CD or DVD-style optical disks or other removable storage in a juke box. The resulting system has almost unlimited capacity yet has extremely high reliability.

In another exemplary aspect, the above controller is inserted within a RAID-aware file system (such as ZFS or described within U.S. Pat. No. 6,671,772 B1 without limitation) or object storage system (such as described in U.S. Pat. No. 7,386,663 B2) such that the storage within the system is used to generate redundant information with various advantages, including greater reliability, etc.

In yet another exemplary aspect, the above technique is teamed with 'Flash Disks' or other storage tending to contain bad regions and/or to 'wear out' under certain usage patterns. By writing data in groups of H units (encoding W units of data), aspects of the innovations herein increase the lifetime and reliability of such a storage device at little or no operational cost, save the loss in capacity represented by the H-W additional units of storage.

Unix-Style 'Filter'

A transforming or 'encoding' program with one input and H outputs generated using one or more aspects of this technology may also be utilized to implement a Unix-style filter. Similarly, a recovery or 'decoding' program with one output and somewhere between H and W inputs using this technology may also be employed consistent with such filtration. Finally, a 'paranoid' transforming or encoding program, which uses more than W inputs (generating multiple models and cross checking), may also be employed to improve accuracy and/or reliability.

Some Exemplary Implementational Enhancements

Figure 10:
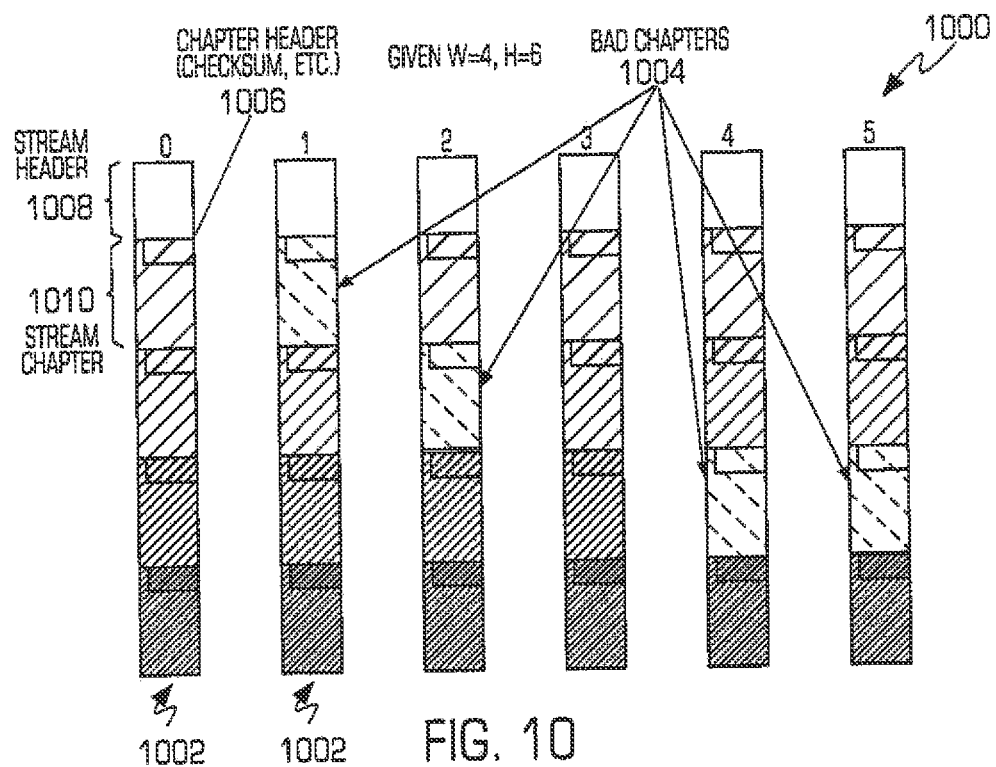
FIG. 10 is a diagram illustrating exemplary data streams consistent with certain aspects related to the innovations herein.

According to further implementations, as shown in part in FIG. 10, intermediate data streams may be augmented by breaking them into sections or "chapters" 1010 and inserting headers 1006, 1008 or other tags or data elements into the data stream. The headers may contain metadata such as length, time stamps, checksums (or other longitudinal error detection and/or correction information), and/or compression information. Inter alia, innovations consistent with these features enable a recovery program to ignore a corrupted chapter on one input stream without terminating the data stream. In very long data transfers, for example, it is possible that all data streams would have corruption so the ability to skip an erroneous chapter (sometime also referred to as a "segment," herein) yet continue to use the data stream in the future dramatically increases he reliability of the system.

FIG. 10 is a diagram 1000 illustrating exemplary divisions of data streams 1002 consistent with certain aspects related to the innovations herein. According to aspects of the present innovations, systems and methods herein may further comprise dividing the H output data streams into chapters so as to produce sets of corresponding chapters of each stream such that a desired chapter of a set may be recovered from corresponding members/chapters of the set.

For example, as shown in FIG. 10, the first segment of stream #1 is a bad chapter 1004. Because of the innovations herein, a damaged chapter may be quickly isolated allowing it to be recovered or to be bypassed in the general recovery process without bypassing the entire stream. Therefore, since in this example W=4, there are 5 segments to choose from while only 4 are required. As a result, the system could use segments from streams 0, 2, 3, and 4 to recover the original data.

If desired, additional recovery models may be constructed involving stream 5 to provide an additional level of checking on the output. Here, there are 5 combinations of 4 'good' streams out of 5 'good' streams so it would be possible to build 4 additional check models. All models would be in conformance unless there is some input corruption. If they are not in conformance, aspects of the innovations herein enable determination of which contributing chapter is in error by elimination. In situations such as this, it is even possible to recover from both a checksum (or similar) error plus an error not caught by the checksum. It is also possible that the network receiver could ask the transmitter to send a redundant segment instead of an entire stream. If, for example, segment 7 had a CRC error, the receiver could ask for another segment 7 to be included in the data stream somehow, or else sent in a new data stream. Then this single redundant chapter is used to overcome the corrupted chapter. The transmitter need not even know which stream's segment was damaged. This affords several advantages, such as reducing the amount of information which must be transmitted.

According to still further aspects of the innovations herein, compression may also be implemented before the data is split. Similarly decompression could take place immediately after the data is regenerated in the recovery program. This becomes a tradeoff of CPU effort versus storage space or network bandwidth. The more CPU power available, the harder the compression algorithm(s) can be worked to increase the net throughput enhancement(s).

Figure 11:
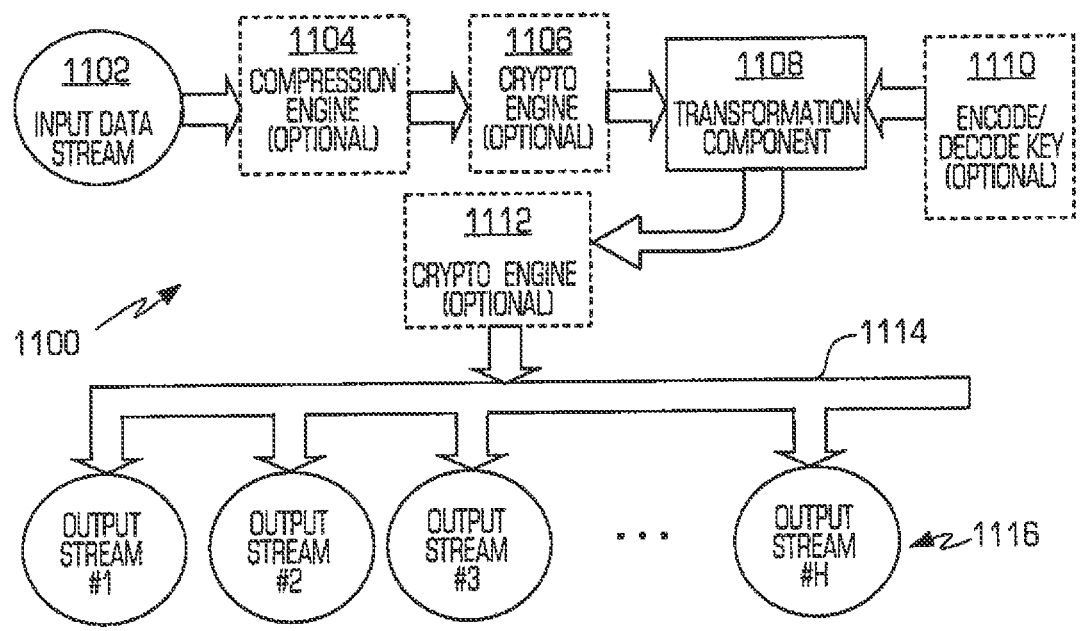
FIG. 11 is a flow diagram illustrating an exemplary transformation process consistent with certain aspects of the innovations herein.

According to additional aspects of the innovations herein, data may be encrypted at various points along the transformation process. For example, as seen in FIG. 11, two advantageous points to encrypt are: (1) between the compression engine 1104 and the transformation component 1108, as shown by crypto engine 1106; and (2) after the data streams have been transformed, as shown by crypto engine 1112. FIG. 11 illustrates an exemplary flow diagram showing transmission of the input data stream 1102 through to the transformation component, where an encode/decode key 1110 may also be utilized. After passing through the optional crypto engine 1112, the transformed data is distributed 1114 to H output data streams 1116.

It is valuable to note that it is only required to encrypt W−H+1 streams to effectively encrypt the output. Furthermore, different algorithms and/or keys could be used on the various outputs.

The data throughput could be enhanced via use of a hardware encoder and decoder. Indeed, aspects of the innovations herein relating to the finite field matrix arithmetic are particularly adapted to a hardware solution. As encoder's coefficients are constants, creation of a dedicated engine is thereby simplified and also affords higher performance. In general, the decoder's coefficients are not known until they are calculated, though they can be calculated in advance and stored until required.

Innovations Over Bit Torrent

Given an exemplary 1 GB data file (a movie or OS distribution or similar) to be distributed to thousands of clients via the internet, aspects of the innovations herein may be used create outputs based on relatively high H and W values (e.g., here, for the sake of illustration, W=32, H=64, though these could readily be larger). These exemplary values would result in each data file being about 32 megabytes, which can then be downloaded quickly given today's network speeds. As clients engage to download the data file, each client is provided a different stream as well as information instructing the clients to communicate with each other to recreate the original file. Once enough streams have been propagated to clients, then new clients need only be instructed how to communicate with other clients to download streams for recreation. Innovations consistent with this approach may have one or more of a variety of advantages: (1) there is a high probability that one can recreate the original file with just W downloads; (2) there is an extremely high probability that one can recreate the original file with W+1 or W+2 downloads, even in the face of noisy transfers and questionable data quality; (3) the original server's bandwidth requirements are very low, as most of the communication comes between clients; (4) if fewer than W streams are generally released, any ultimate client can be required to contact the original server (or equivalent) for the final stream which effectively allows the owner to control access without the overhead and/or (5) all of the other advantages of Bit Torrent are maintained. Further, according to certain implementations, none of the streams are in violation of various regulations such as those concerning privacy, personal and/or financial informational, copyright violations, etc., since the streamed data does not contain the original content, nor is it sufficient to recreate the original content. Moreover, a majority of the processing nodes, such as distribution nodes or download sites may be configured such that they cannot possibly recover the original data on their own absent explicit provision of decoding information (recovery matrices) necessary to recover the plaintext data. Indeed, such configurations may commonly be desired for reasons such as the security features and/or other innovations set forth herein.

The following example illustrates innovations consistent with the above. Given a 1 TB file to be moved from site A to sites B and C, where all of the sites have dedicated TI lines (~0.2 megabytes/second) between each other. If ftp(1) is used to transfer the files, it would take 1024/0.2 second or about 1.42 hours to get the file to B and C assuming no slowdowns or overhead. However, according to the innovations herein, the file may be split (into "shards") using W=2, H=2 (or more), then you could send the first half of the stream to site B and the second half to site C along with instructions for sites B and C to share data. These instructions may include data enabling retransmission of the substreams to the recipients such that transmission bandwidth is increased. Here, then, it would take 0.71 hours to move the data. Moreover, as additional destination sites are added, using higher W and H values, transmission times are reduced at an increasingly higher rate. Indeed, the more concurrent downloads, the higher the effective bandwidth becomes. Alternately, additional connections could be employed to carry additional redundancy (W<H) to allow for continued operation in the face of communications failures. It is possible to dynamically change W to trade off reliability and throughput.

With regard to technical descriptions of this functionality, systems and methods herein may comprise splitting the H output data streams into shards so as to produce sets of corresponding shards of each stream such that a desired shard of a set may be recovered from corresponding shard members of the set, and saving the shards to media storage components for storage or to enable transfer to another location, wherein only a subset of the media storage components is needed to recover plaintext data as the input data may be recovered from a set of at least W members of each set of the corresponding shards. Further, saved shards may be configured for transmission via multiple paths such that transmission bandwidth is increased and/or recoverability of the shards is enabled. Here again, only a subset of the media storage components is needed to recover plaintext data as the input data may be recovered from a set of at least W members of each set of the corresponding shards.

Additionally, if the connections are 'lossy,' then W and H may be increased to maintain high data transfer rates despite the losses. Increasing W breaks the output into smaller streams which are faster to send. Increasing H generates 'extra' streams which will make it easier to recover if a stream is corrupted. According to aspects of the innovations, here, incremental streams may simply be sent until the recipient site indicates that it has received enough streams to recover the original data.

Other aspects achieve innovations with regard to software distribution. Given a piece of software (or other big binary object), the contents can be split up and placed on a DVD or equivalent distribution media with fewer than W pieces. As a result, end users can load the DVD onto their systems but not use the software (or data) until the final piece or pieces are provided (by media, internet, etc.). This provides a nice license validation mechanism and guarantees only users with access to the last piece ('the license key') would be able to use the software. For example, the one or more final shards required to complete the software or data item are only transmitted to a node that provides consideration and/or satisfies a condition. These innovations also extend to encryption features, as random data may be inserted into the shards such that recovery of plaintext data further requires information regarding the inserted random data.

Aspects of the inventions, innovations and technologies herein may be also based upon coding theory which implements Reed Solomon Erasure Codes. Applications of such Codes for disk storage is set forth in U.S. patent application Ser. No. 10/845,546, published as US 2005/0257083A1, which is incorporated herein by reference in its entirety. In short, an array of H disks can be configured for W data disks and H-W redundant disks. Such an array can recover the written data so long as a total of W disks survive, (H<W) For example an array of 16 disks with 12 data disks. Any 12 disk subset of the 16 disks can be used to recover all 12 disks worth of data. The other 4 disks are called 'redundant disks' because they contain 'redundant data'—data which is not the plaintext but is in fact derived from the plaintext.

Aspects herein may involve data on the data disks not being stored. In one exemplary implementation, an array of 16 disks with 4 data disks may be created, which gives 12 redundant disks. However, the 4 data disks may be disregarded or, in fact, never implemented. Here, then, no disk contains the original plaintext, yet every byte of data can be recovered. The mathematical term for this is that the system is no longer systematic. Indeed, in the above example, all that is required for recovery is any 4 of the 12 redundant disks. However, none of the existing disks contains the original data.

With regard to just data—either files, streams of data, backup tapes or other abstractions. In the above example, if the data was stored on 12 backup tapes or DVDs, then only 4 would need to survive. An administrator could send three disks to four different locations. Or even one disk or tape to each of 12 different locations. A thief would have to recover disks from more than one location before the backups could be read. Thus greater privacy along with higher reliability may be afforded by such systems, methods and components. Cryptologists refer to this as a "Shared Secret" problem.

In the case of a single stream of data, it is trivial to make the data 'appear' to be multiple streams. One trick is simply to pull off chunks of a data stream and number them 0 through H−1as required. Doing this at the byte level is easy. This approach generates H input streams quickly and simply. The only downside to this approach is that the output must be padded and up to H−1 additional chunks of data could be output. The system must somehow know to remove the padding or ignore it somehow. This is analogous to performing byte-level operations on a word addressed computer.

Further, by performing compression before processing, overhead of the redundancy can be reduced dramatically, while at the same time substantially improving the chances of recovering the compressed data in the future. Indeed, aspects herein overcome drawbacks in systems where data can usually only be recovered from the plaintext, not from a compressed file. Using the present innovations, the odds of having a corrupted compressed file drop dramatically. As such, the reliability of compression increases—at the cost of more bits. While compression may be ignored in some situations, in certain implementations it mitigates the growth in bits of output.

Compression can be viewed as reducing the entropy of data. Encryption can be viewed as hiding or increasing the entropy of data. The redundancy transformations described herein can be viewed as increasing the entropy of data. The amount of effect of each of these transformations can be selected or controlled. Collectively, compression, redundancy and encryption can be viewed as entropy modifiers which can be used in various quantities to achieve specific needs for reliability, privacy, secrecy and compactness/performance.

Further, when data is stored with an error check or correction code (ECC, CRC, etc.), then if we have a vector of input sectors 'A' and 'B' output sectors which follow the math herein described, then the mathematical relationship between the data in A and B is also reflected in the error check or correction codes for A and B if the error check or correction code form a group with the associated data.

With regard to compression before processing, one can normally reduce the overhead of the redundancy dramatically while at the same time substantially improving the chances of recovering the compressed data in the future. Many people, however, are reluctant to use data compression because of its notorious reputation for yielding corrupted compressed files or file systems. Moreover, the general belief is that data can usually be recovered from the plaintext, but can't be recovered from a compressed file, By utilizing the present invention, however, the odds of having a corrupted compressed file drop dramatically and hence the reliability of compression goes up—at the cost of more bits. Here, it should be appreciated that, although compression is included in an embodiment of the invention so as to mitigate the growth in bits of output, it is expected that in many cases (such as MPEG streams) it will be ignored all together.

One of ordinary skill would readily appreciate the advantages of the process provided by the present invention. For example, if one chose to encrypt the output of the process, it would only be necessary to encrypt H-W+1 streams of output since the remaining W-1 streams could not be recovered directly without solving the encryption. Also, a net result of the process is that one can recreate a damaged ECC header, wherein a much greater recovery than otherwise possible is achieved since the strength of the error correction scheme is multiplied.

A brief explanation regarding the underlying mathematics of the invention is now provided. First, we consider having a vector A of input values W long, wherein we can create a family of H linear equations in W variables such that any subset of W equations is sufficient to recover the original input vector. In vector notation, this equation can be written as $$A*D==E$$

Where A is a generator matrix of width W and height H which generates the equations, D is the data vector and E is the result vector.

The generator matrix, however, must have some special properties. For example, the generator matrix must never be singular (i.e., it must always be solvable), even when an arbitrary collection of rows is removed (i.e., as long as there are at least W rows remaining). Here, it should be noted that the matrix used is a Vandermonde matrix derivative which is defined as follows:

$$V = \begin{bmatrix} 1 & 2 & 3 & \dots \\ 1^2 & 2^2 & 3^2 & \dots \\ 1^3 & 2^3 & 3^3 & \dots \\ \vdots & \vdots & \vdots & \ddots \end{bmatrix}$$

or $$V_{x,y}=x^y$$

The array continues without end to the right and downward. This matrix has the unique property that it always produces linearly independent (orthogonal) equations. In other words, regardless of how the matrix is subset, it may always be inverted.

There are other generator matrices which have the same invertibility property for all encounterable recovery situations. The use of the Vandermonde-derived generator is provided as only one of a large number of acceptable generators.

In an embodiment of the invention, the matrix is subset by leaving off the first row (which is trivial but not required) and then selecting H rows which are W wide.

To work a simple example, assume the input is D=[3,1,4,1] and H=5, which would result in the following situation:

$$\begin{bmatrix} 1 & 2 & 3 & 4 \\ 1 & 4 & 9 & 16 \\ 1 & 8 & 27 & 64 \\ 1 & 16 & 81 & 256 \\ 1 & 32 & 243 & 1024 \end{bmatrix} \times \begin{bmatrix} 3 \\ 1 \\ 4 \\ 1 \end{bmatrix} =$$

$$\begin{bmatrix} E_0 \\ E_1 \\ E_2 \\ E_3 \\ E_4 \end{bmatrix} = \begin{bmatrix} 1*3+2*1+3*4+4*1 \\ 1*3+4*1+9*4+16*1 \\ 1*3+8*1+27*4+64*1 \\ 1*3+16*1+81*4+256*1 \\ 1*3+32*1+243*4+1024*1 \end{bmatrix} = \begin{bmatrix} 21 \\ 59 \\ 183 \\ 599 \\ 2031 \end{bmatrix}$$

So, the 'redundant values' are E=[21,59,183,599,2031]. Using any four of these values, the original data in the D vector may be recovered.

Now assume that one wishes to recover using only the first four rows. In this case, the recovery matrix may be calculated by creating a four-by-four matrix using the top four rows of the generator matrix and the corresponding four entries of the E matrix. (Note: If the $3^{rd}$ row was to be omitted instead, then the third E entry would have been deleted. If, instead the first entry in E was lost or destroyed, the first row of the generator matrix would be removed instead. Extra rows and values of E are simply discarded (or used for check values). The only requirement is that the remaining generator matrix is square.) Inverting the matrix would then solve the simultaneous equations, wherein it is again noted that any encounterable subset of the generator matrix may always be inverted.

$$\begin{bmatrix} 1 & 2 & 3 & 4 \\ 1 & 4 & 9 & 16 \\ 1 & 8 & 27 & 64 \\ 1 & 16 & 81 & 256 \end{bmatrix}^{-1} = \begin{bmatrix} 4 & -4.3333 & 1.5 & -.1667 \\ -3 & 4.75 & -2 & .25 \\ 1.3333 & -2.3333 & 1.1667 & -.1667 \\ -.25 & 0.4583 & -.25 & .04167 \end{bmatrix}$$

Next, we simply multiply the recovery matrix by the E matrix (with the missing row) to realize the original data, wherein rounding off to nearest integer may be required:

$$\begin{bmatrix} 4 & -4.3333 & 1.5 & -.1667 \\ -3 & 4.75 & -2 & .25 \\ 1.3333 & -2.3333 & 1.1667 & -.1667 \\ -.25 & 0.4583 & -.25 & .04167 \end{bmatrix} \times \begin{bmatrix} 21 \\ 59 \\ 183 \\ 599 \end{bmatrix} = \begin{bmatrix} 3 \\ 1 \\ 4 \\ 1 \end{bmatrix}$$

It should be noted that there are several drawbacks with the approach just described. Round-off errors, for example, might be prevalent, which may result in a recovery of data that is different than the initial data. Also, because the number of bits required to store the E array entries isn't fixed, it could take many more bits to store $E_i$ than to store $D_i$. Therefore, in order to efficiently and effectively bound the number of bits required, it is generally desirable to express $E_i$ in the same number of bits as $D_i$.

Another approach, however, is to substitute traditional arithmetic with finite field (Galois) arithmetic using base 4, 8, 16, 32, etc. Several aspects of implementing such finite field arithmetic must first be noted. For example, assuming base 8, there are at most $2^8$ or 256 values for base 8, which means the symbols represent 0 . . . 255. As such, all operations must map back within this range (by definition). In other words, no matter what sequence of operations are performed, a value in the range 0 . . . 255 must be returned. As a result, "wrap around" effects may yield unwanted complications. Subtraction ('−') is identical to Addition. Further, addition ('+') is implemented by the XOR operation on the binary representation of the number. This means that 4+1=5 but 4+4=0. Also 4−1=1−4=5. Multiplication is implemented as the discrete antilog of the sum of the logs of the arguments. Similarly, division is the discrete antilog of the difference of the discrete logs of the arguments. Generation of the discrete logarithm tables is simple given the bit pattern for the generating polynomial.

The Vandermonde generator matrix now begins to look a bit different.

$$\begin{bmatrix} 1 & 2 & 3 & 4 & \ldots \\ 1 & 4 & 5 & 3 & \ldots \\ 1 & 8 & 15 & 12 & \ldots \\ 1 & 3 & 2 & 5 & \ldots \\ \vdots & \vdots & \vdots & \vdots & \ddots \end{bmatrix}$$

Since multiplication is 'closed' in this type of arithmetic, there is no way to overflow. Further, the results are precise, without round off error, and they take up exactly the same number of bits (in this case of base 8, it takes up 8 bits).

The code required to multiply and divide requires sufficient processing such that it is worthwhile to build up multiplication and division tables. In base 8, the tables are really arrays of 256×256 or 64K bytes. For base 16, the tables would be 8 gigabytes long each which is currently impractical. However, since we will seldom need the entire table, a preferred method is to generate C*X tables where C is a constant. These tables would be 2 bytes per entry for base 16 so they would be 128 KB each. For the above Vandermonde matrix subset, there are 8 discrete constants (1,2,3,4,5,8,12,15) so the multiplication tables would require 1 megabyte. The x1 table can be omitted for further savings since unit multiplication is defined as an identity (the same as addition or subtraction of zero). Division is used sufficiently seldom that the division table could be eliminated and instead use the example C language routine while having little real performance impact in most situations.

Since the contents of the Vandermonde matrix are known in advance, such components make it possible to speed up the process dramatically.

Systems, methods, and components may also implement features akin to encryption keys by specifying which rows of the Vandermonde matrix are used to generate which output streams. There is no requirement that the rows be sequential or in any order.

This provides, inter alia, low level encryption/encryption features at zero additional compute overhead.

Innovations consistent with products using this technology include efficient performance of the matrix multiplication to generate the redundant data. A matrix will seldom have to be inverted since one will seldom be loosing different data sources. While it is possible to hard code the matrix multiply on the generation side, it is more difficult on the recovery side since the values are not known in advance.

Figure 12:
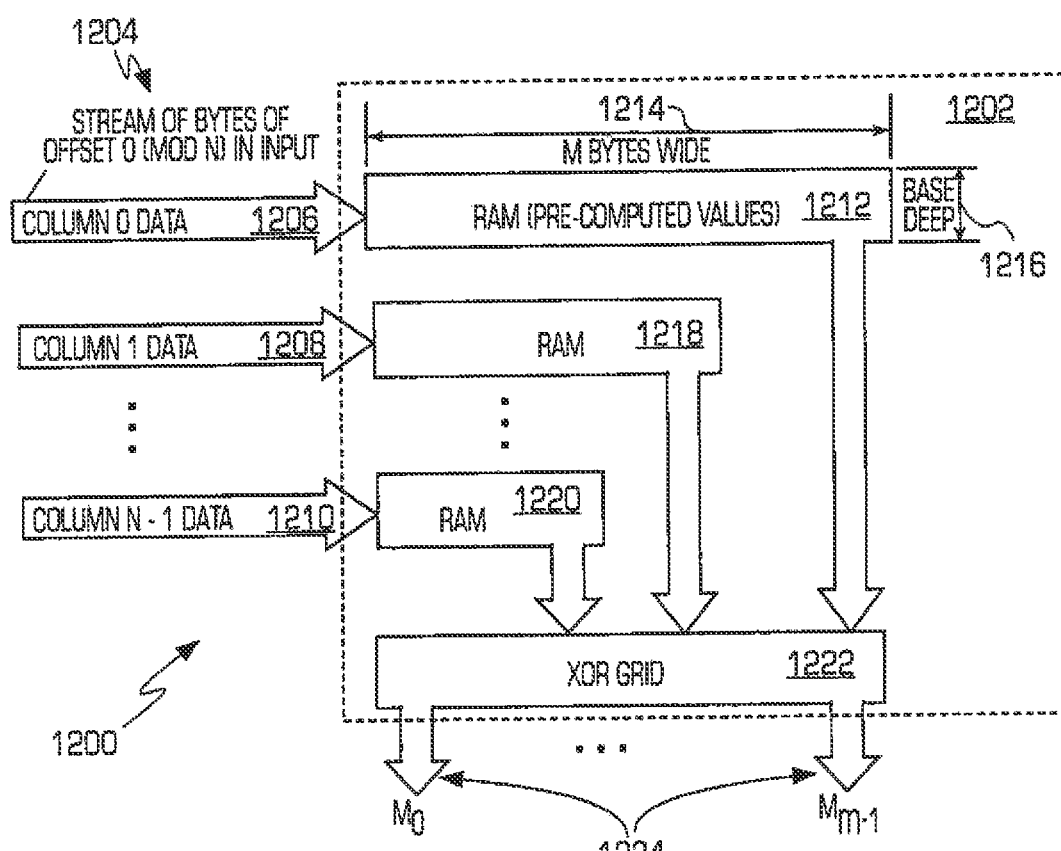
FIG. 12 is block diagram illustrating exemplary hardware/logic components consistent with certain aspects related to the innovations herein.

Turning back to another exemplary hardware implementation, FIG. 12 is block diagram illustrating hardware/logic components consistent with certain aspects related to the innovations herein. Environment 1200 of FIG. 12 shows transmission of streams of bytes 1204 to a computer processing component or device 1202 containing RAM and computational elements capable of implementing the innovations herein. Processing device 1202 may include RAM components 1212, 1218, 1220 loaded with the pre-computed matrix information of width 1214 specified by the matrix and base operating system, as explained above. In this example, the streams 1202 correspond to columns of the data, and each stream is mapped to the appropriate tables or RAM segments containing the values for the matrix in question. After the matrix multiply operations are performed, the intermediary values and passed to an XOR grid 1222 to perform a summation procedure that produces the final output data or streams of output data 1224. FIG. 12 may be the basis for either a dedicated hardware, FPG or software approach. Processors with wide data paths can calculate multiple H channels in parallel. 128 bit wide SSE-style registers or simply 64 bit accumulators can be used to calculate 16 or 8 channels respectively. This takes advantage of the fact that the encodings can be known a priori.

Further Implementations:

In the further implementations, below, the transforming/coding features/innovations of the present disclosure are sometimes referred to as "Pluribus," for purposes of ease of explanation.

Exemplary (Privacy) File Systems

In some implementations, a privacy file system can create a folder (e.g., on your laptop) which may appear and disappear based upon a variety of criteria, such as at the users discretion. The following features are discussed in the context of a laptop, though are not limited thereto. When this folder disappears, there is no data on your laptop so the theft or hacking of your laptop would not reveal any of this private information. However, when the folder was present, the contents would be totally available in the same way as any other folder on your machine. And, if your machine is ever lost or stolen, the most recent contents of this folder are recoverable, I.e., still available, and may be loaded on your replacement laptop.

Figure 13:
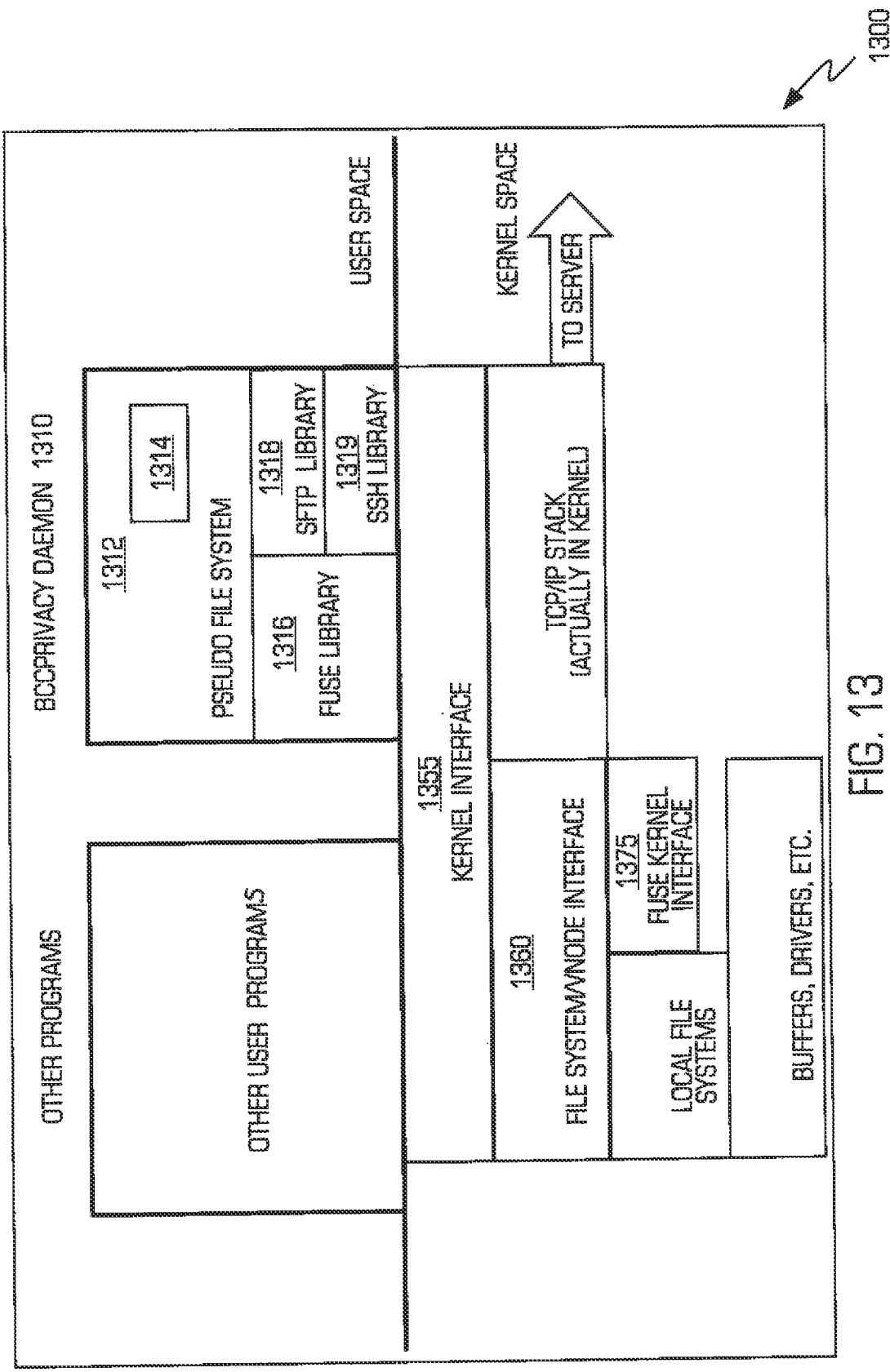
FIG. 13 is a block diagram illustrating exemplary components/modules that may be associated with exemplary data processing features consistent with certain aspects related to the innovations herein.

Aspects of this innovative implementation may use the FUSE library (which implements a file system interface for Linux, FreeBSD, Solaris and OS X), an SFTP library (which implements remote UNIX-like file operations) and the transforming/coding innovations herein, to perform particular processing with the data. Such aspects may be considered, inter alia, in association with FIG. 13. FIG. 13 is a block diagram illustrating exemplary components/modules associated with such data processing features; given an arrangement that implements the present transforming/coding innovations 1314 within FIG. 13, for example, opening and reading a file consistent with the implementations, here, may include:

1. User program calls open(2) to open a file in the privacy folder, translating into a system call from the user program across into the kernel and the kernel interface 1355.
2. Kernel interface 1355 recognizes that this is an open(2) call and forwards the request to the VFS file system interface.
3. File System/VFS interface recognizes that the file in question is in the privacy pseudo file system area so it forwards the request to the vfs/vnode component in kernel for the FUSE (File systems in User SpacE) facility.

4. A FUSE kernel component 1375 may then translates the open(2) request into a message and sends it up through the kernel interface to the privacy pseudo file system daemon 1310 where it would go to the FUSE user space library, 5. A FUSE library 136 may then turns to the BccPrivacy pseudo file system 1311 which may then go through the motions of opening a file.
   1. Pseudo file system opens the local shard file by calling the open(2) system call for the shard file in the hidden local disk area. (If no local shards are stored, this step is omitted.)
   2. Pseudo file system opens the remote shard file(s) by calling the sftp_open( ) call in the SFTP library 1318 (which uses the SSH library 1319 and the kernel's TCP/IP interface) to talk to a remote server or servers. (If no remote shards are stored, this step is omitted.)

6. Pseudo file system returns success to the FUSE library 1316 which returns to the FUSE kernel module.

7. FUSE kernel module returns to the VFS/vnode interface which ultimately returns to the user program as a successful file open.

When the user application wishes to read, the process is analogous.
1. User program calls read(2) to read the opened file in the private folder, translating into a system call from the user program across into the kernel and the kernel interface 1355.
2. Kernel interface recognizes that this is an read(2) call and forwards the request to the VFS file system interface.
3. File System/VFS interface recognizes that the file in question is in the BccPrivacy area so it forwards the request to the vfs/vnode component in kernel for the FUSE facility.
4. FUSE kernel component then translates the read(2) request into a message and sends it up through the kernel interface to the daemon where it goes to the FUSE user space library.
5. FUSE library then turns to the pseudo file system which then goes through the motions of reading a file.
   1. Pseudo file system reads the local shard file by calling the read(2) system call for the shard file in the hidden local disk area. Locally, the daemon will read the specified set of data (e.g., 7 bytes for each 8, etc.) in the read request (padded appropriately on the front and back).
   2. Pseudo file system opens the remote shard file(s) by calling the sftp_read( ) call in the SFTP library (which uses the SSH library and the kernel's TCP/IP interface) to talk to a remote server or servers. The daemon will read a subset (e.g., 1 byte for each 8, etc.) in the read request.
   3. Pseudo file system uses The transforming/coding innovations herein to reconstruct the original content. In the example, given the 8 wide nature of the storage model, the pseudo file system is required to recreate the original file starting at an 8 byte boundary and for a multiple of 8 bytes in length. If the read request does not start and end on an 8 byte boundary, then the pseudo file system must enlarge the read as required for the present innovations.

6. Pseudo file system returns the requested data to the FUSE library which returns to the FUSE kernel module.

7. FUSE kernel module returns to the VFS/vnode interface which ultimately returns the data to the user program as a successful file read.

With no loss of generality, the FUSE library could be replaced with an alternate method of responding to file system calls and the SFTP library and protocol could be replaced with any other suitable protocol.

In the exemplary implementation, each file is broken into 8 pieces with all 8 required to recover the data. Then 7 of the shards are stored locally in a hidden folder while the last shard is stored on a remote server, using, e.g., encrypted SFTP across the internet.

The net result is that when the file system is mounted, the files are visible and accessible. In fact, with a common speed internet connection, the access is not visibly slower than the local disk (it is a slower, but the performance difference may not be obvious—especially if compression, caching, read ahead and write behind along with other optimizations are used). On a local LAN, the speeds are similar to local disk. Access to the files requires that successful authentication of the SFTP session with the backing server. If the account is frozen or fails to work for any reason, the user cannot access the 8th shard so the original data remains private and safe.

If the laptop is lost or stolen the corresponding server account's password or other authentication technique can trivially be changed allowing resumed access by the authorized party while the private date continues to be safe. Any attempt by an unauthorized third party to access this folder will fail so the data will be unrecoverable.

In another implementation, i.e., when 16 shards are created (with 8 required or W=8,H=16), then it is possible to store the shards with 7 on the local machine, five on the primary server and four on a secondary server. (Obviously, this is an example, there are infinite variations possible.) In this situation, access to any two of the three machines is all that is required to recreate the contents of the private folder.

Under Microsoft windows, it is possible to implement privacy file system(s) as guested file system(s). However, a privacy file system may also be implemented as a file system filter. Filter arrangements enable the implementation of policies such as that all .doc files must be processed. Further, these filter arrangements may decide on a file system call basis whether or not to honor a request, and how to honor the request. One specific variation includes installing a filter on any removable device's (or networked) file system and then blocking file creations and writes which violated a policy. Another variation includes limiting access to private files to specific applications (e.g., making it difficult to copy them, otherwise leak them, etc.). A valuable feature entails storing the required policy information remotely and download it once one is authenticated. This enables remote processing advantages, central administration, etc. It also enables use of a variable number of shards (from 0 locally to H locally) along with the number and distribution of remote shards.

Another Exemplary Implementation

Figure 14:
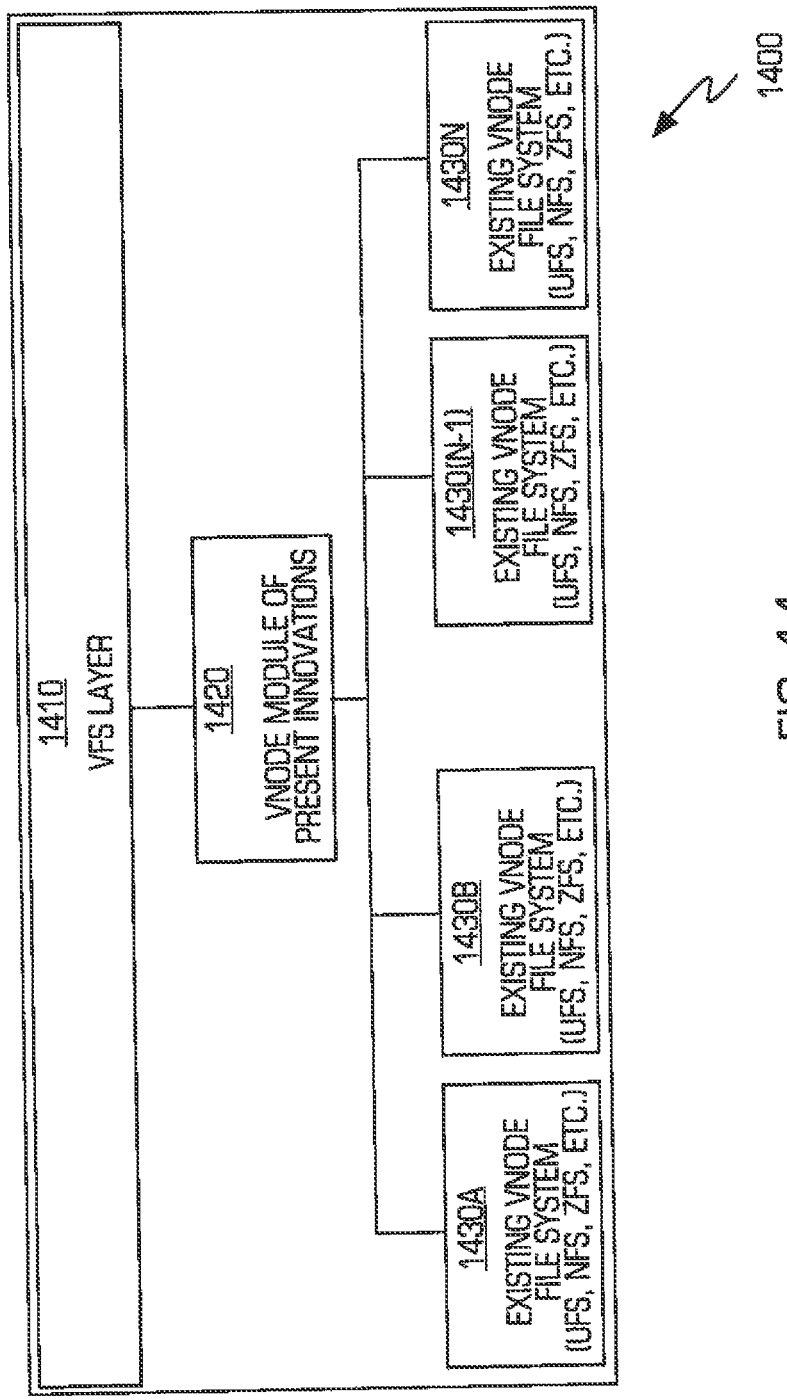
FIG. 14 is a block diagram illustrating an exemplary module/components that may be associated with exemplary file system/privacy features consistent with certain aspects related to the innovations herein.

According to other implementations, the features herein may be achieved by creating a stacked v-node privacy file system module which sits in the kernel, as shown by way of example in FIG. 14.

In these implementations, open requests come in from the VFS layer above 1410 (i.e. through another Vnode module, etc.). The privacy file system module would allocate the necessary memory for open state and then perform the open operation(s) against the lower virtual file systems. When the opens are complete, the privacy file system module returns to the VFS layer with status. The "close" function works in a similar way.

Read and write operations invoke the corresponding vnode methods through the transforming/coding module (e.g., 1420, 1314, etc.). The module would decide which lower VFSs would be involved (e.g., 1430A-1430N), and perform any required reads and writes along with the required blocking/unblocking for the transforming/coding operation(s).

Features of this approach versus the FUSE approach include that this is a much higher performance interface and has much lower overhead. Furthermore, there is much more flexibility in exporting a fire system at this level than through FUSE.

Here, configuring the transforming/coding module in kernel space will take place at mount(2) time, under user control or dynamically as a function of file system metadata. At that point it will be necessary to inform the kernel module which VFSs to use for a given mount point along with auxiliary information required to successfully use these VFSs.

Sub-Implementations

There is no hard and fast requirement that ANY shards should go to any location. For example:

Highly Secure Files

Files are created that have no local shards. All access must be remote. Here, for example, files may be tagged with special metadata to indicate the permissible sharding policies, then some appropriately-tagged files (or entire subfolders) may be restricted this way. Furthermore, operating system specific operational limitations such as read-only restrictions, copy restrictions, and other use restrictions can be centrally enforced as desired.

Data Haven (I)

For certain data haven implementations, no shards are kept local and only a small number (with no loss of generality, consider one shard) per remote location, it would be possible to create a widely disbursed and highly redundant data archive. In the case of an international distribution of machines (say one per jurisdiction), then the actual data would not be present in any one jurisdiction since the information stored would be insufficient to recover the original data.

Storage, here, could be used for live data (such as email, financial records, design data, etc.), for backups, or for archives or any other purpose.

Data Haven (II)

In some implementations, there is no reason not to keep some shards locally, so long as there are sufficient shards stored remotely to recreate the data. However, if some shards are kept locally, the data can be recovered more quickly (from the standpoint of the normal user operating in a normal situation). Here, the number of shards kept locally could be anywhere from 0 through more than the threshold for recreation depending upon the user's performance, security, reliability and privacy requirements.

Caching and Pre-Reading

In implementations benefiting from caching or pre-reading, the innovations herein are configured to begin reading a file when it is opened and then caching it in RAM. Similarly, further advantages may be achieved by batching writes back to the backing servers. (For example, writing one entire shard back at a time rather than all at once. Using such features, if there is a crash, these implementations are able to recover the entire state of the file from the local shards and one remote shard. Further, the first remote shard(s) may be written synchronously and the other shards may be written asynchronously for a tradeoff between security, reliability and convenience/performance.)

Compression

Some implementations also use compression as an adjunct to this technology. Compressing a file before it goes through the system will magnify the effective bandwidth of the internet connection, though it will not have much impact on the latency (which is often a larger user-visible source of delay in most low bandwidth situations). Here, implementations utilizing compression and pre-reading features are a good way to address certain latency issues.

Privacy Router/Routing

Figure 15:
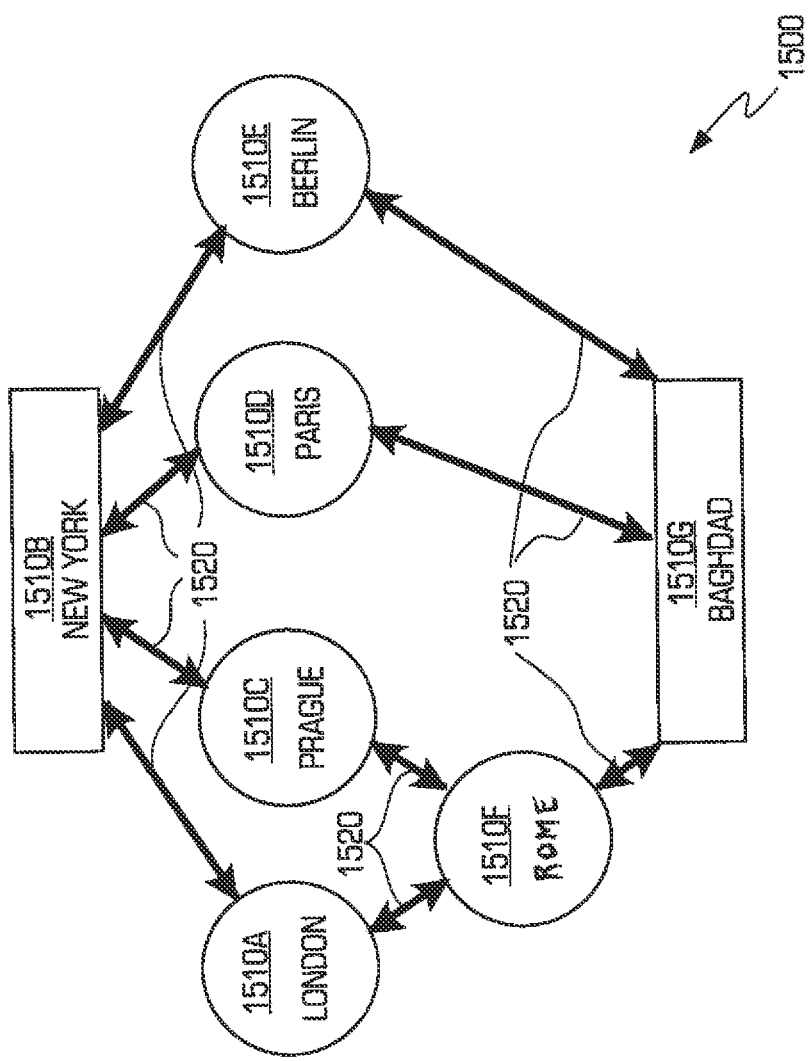
FIG. 15 is a diagram illustrating exemplary locations/computers/routing aspects consistent with certain aspects related to the innovations herein.

Assume, as shown in FIG. 15, that you have computers in cities 1510, such as New York 1510B and Baghdad 1510G. Furthermore, you have (presumably) secure connections between New York and London 1510A, Prague 1510C, Paris 1510D and Berlin 1510E. Rome 1510F is securely connected to London 1510E, Prague and Baghdad. Baghdad also has connections 1520 to Paris and Berlin.

Here, we may use aspects of the transforming/coding innovations herein to split the network data into 4 shards with only 3 required to recreate the data, and then send the data from New York to Baghdad via London, Prague, Paris and Berlin. The loss of one of those primary connections would not result in the loss of connectivity or loss of data. Furthermore, anyone eavesdropping on any of the network connections would not be able to recreate the data. (In this example, eavesdropping on the Rome to Baghdad connection plus the Baghdad to either Paris or Berlin connection would be sufficient.)

Some features of this configuration may include:

Greater security—an eavesdropper must now listen to multiple paths and correlate the traffic. In fact, when used in conjunction with encryption technology this becomes extremely difficult. Compression can multiply the security value.

More reliability—the loss of a connection doesn't result in the loss of data or connectivity. This applies to intermittent data loss and complete loss of connectivity.

Higher net throughput—The usable bandwidth between New York and Baghdad is much greater than available on any single link. In fact, assuming that all links are of unit capacity, this configuration yields effective throughput halved by the fact that the Rome to Baghdad link carries double duty. However, the effective throughput would still be 150% of a single link, more with compression.

Even higher net throughout—if Rome neglects to forward the traffic from one of its 'upstreams' then the total throughput goes to 3×.

Privacy Cache/Caching

Privacy cache implementations allow for the caching of a given file, without having a copy of the file anywhere. Using The present transforming/coding innovations+privacy cache implementations, the file is broken into many pieces, with the pieces spread into several machines (perhaps in several locations—even perhaps several jurisdictions). Here, no single machine contains the original file, nor does it contain enough information to recover the original file therefore storage of this data does not entail possession of secure/ secret files, violation of copyrights, etc.

Privacy Policies

A Privacy File System consistent with the innovations here can be made even more secure with a simple addition: adding a connection policy module which specifies the conditions required to allow authentication. For example, if you don't want TSA to be able to see your private data, simply tell the server not to authenticate your laptop during the time from before your light until after your flight. As such, features here could be implemented via a 'time lock' policy. Another policy might include (or exclude) IP address, originating city, and/or any other definitive data points.

Features may also be added enabling the server to notice repeated failures to authenticate and invoke some specialized authentication policy which could do anything from disabling the account, to throwing an alarm, to requiring extended authentication before allowing operation, etc.

Similarly, features may be included such that the server would fake the authentication process, while providing some 'honey pot' type of functionality or another type of Byzantine failure while (optionally) recording the accesses and flagging the IP address for a recovery action.

Shard Sizing Implementations

According to some implementations, operation of the present transforming/coding innovations may make all shards the same size, each 1/wth of the input file (where 'W' is the number of shards required to recreate the input). However, to provide implementations that do not entail such sizing, the generator matrix is modified such that some shards produce new values less often than others. This produces different sizes of shards.

For example, if the first shard is a function of 4 columns and the second is a function of 16 columns, then the first shard will yield four times as many values as the second. As long as the system of equations is solvable (linearly independent), the system works.

Multi-Server Implementations

Multi-server implementations are useful in certain situations, e.g., when demands of peak traffic/load are too high, such as a heavily trafficked web site which vends constant content (maybe pictures or equivalent). A site, for example, having millions of pictures which may be fetched in any order, with many thousands of requests per second at peak times. It can be a real challenge to scale a system to handle this type of load because traditional caching techniques won't help that much. (In fact, if the load isn't the proper type, caching won't help much at all.)

One 'standard' approach would be to build a set of similar backend servers with complete copies of the data. The size of the backend servers would be selected based upon throughput and reliability requirements. Then (optionally) the backend servers would communicate with the front end servers via a load balancer or some other way to handle things when a server goes offline.

Instead, here the images are run through A transforming/coding component consistent with the innovations herein to create 100 shards with say 4 required to recover the image. Next, put one set of shards on each of 100 backend servers (all of the #3 shards go on server number 3 and so on). Then, on the front end servers, use a method to select 4 (or more) servers to vend a given request. Then the front end server recreates the image.

The net effect is that the 100 servers now have 25× the throughput of a given server. Furthermore, each server needs only 25% of the storage required to hold the entire set of pictures. Furthermore, the loss of a machine doesn't keep the images from being served. The front end machine simply contacts ANY other backend server for the required information.

Optionally, the front end server may be configured to not query the failed backend server for a period of time, or to invoke some other failure avoidance strategy.

Further innovations herein overcome a variety of data security issues for laptops, such as: (1) the recent claim by some governments that they have the right to read/copy the content of laptops entering/leaving the country, which means the content in a laptop will be mishandled by such governments and either damaged, destroyed or released into the wrong hands; an (2)laptop theft or loss that results in releases of confidential information.

When subject to such risk, such as when one wishes to travel internationally, a special implementation of the innovations herein may perform processing on some or all of the laptop files and produces a Pluribus 'spit' of the laptop's contents. Less than 100% of the required information is left on the laptop. Excess data is stored either on an internet accessible site or some other convenient storage medium. The actual files on the laptop are erased (repeated overwrites with random bits) before being deleted. Other important security 'housekeeping' functions may also take place (deleting of cached internet files, temporary files, etc.). The only file left is a compound stream with insufficient information to retrieve the original data.

When a prying snoop (legally or illegally) copies the hard disk, the Transformed/coded file will be found and no other data. Here, then, no recreation of the original data is possible, since insufficient information is present. Further encryption of the file will also make it that much more difficult to read.

When one gets to the destination, one provides the missing information content and allows the laptop to restore. This missing information content may be provided via the internet or from another convenient storage medium. Further, if the laptop is destroyed or stolen, the excess information stored off of the laptop allow its contents to be recreated.

Moreover, still other implementations use multiple streams of chunks of external data. Division of the remote data into many pieces provides for even greater security features.

Examples of Implementations Realized Functionally

1. Information—The present transforming/coding innovations work in a rational manner—recovering H streams from W streams (H<W). For example, the data could be split into 20 streams with 10 required for recovery. Then 9 of the streams could be compounded into a single data file while the other 11 could be stored elsewhere. The net result would be that only 90% of each bit was present and that information was 'blurred' over many adjacent bits. The compounded Pluribus data file would be 90% of the size of the equivalent data (assuming no compression). Recovery would require (at a minimum) adding one more stream (10%) to recreate the input.
2. Computation—Adding streams to the mix makes computation more difficult but provides finer grain control. For example, 20 on 30 with 19 streams on the laptop would reduce the amount of data transferred to 5% of the overall amount, but noticeably increases the computation effort.
3. Reliability—The number of streams can be minimized by reducing the ability to recover from the loss of the laptop. Ideally, it should be possible to recover from a loss of the laptop plus one or more streams stored elsewhere. The actual number is a customer decision.

4. Encryption—Encrypting the compound stream on the laptop might be useful. Same with the remote data.
5. Compression—Compressing the content before Pluribus processing and/or encryption is a good idea when there is ample CPU time.

Implementation Aspects

A. Normally, implementation does not process all of the files on a laptop, but simply the user content, the 'home directory' or 'My Documents' section. This eliminates issues having to do with bootability and software recoverability.

The creation process may include several stages:

First a 'tar file' type of archive is created. This file may contain path and other metadata concerning the file along with the file's contents.

(optional) The archive is reduced in size by removing duplicate blocks.

(optional) The archive is compressed. On a modem multi-core CPU, it is possible to dedicate one or more cores to this task.

(optional) Next the archive is compressed using any convenient method.

Next, The present transforming/coding processing takes place. For example, the archive may be read in groups of H bytes and produce W streams of data in output (1 byte per output stream for each H bytes of input). A subset of these streams may be compounded (intermixed in a convenient manner) to produce the Transformed/coded file on the computer. The remaining streams can then be stored elsewhere.

Finally, the program cleans the computer by scrubbing and erasing the data in the files along with other housekeeping tasks.

Recovery is Simple:

Open the Transformed/coded file and the other streams. Select the suitable number of streams to recreate the archive.

Process the file through Pluribus and the optional stages to recover the archive.

Split the archive and restore the files.

(optional) Delete the Transformed/coded file.

Further Nuances:

The innovations herein may determine when files have changed and then only creates 'incremental' files corresponding to the changes.

By means of the innovations herein, this functionality may be embedded into the operating system or the file system such that the splitting and merging are done transparently to the user.

The present innovations may also store the encryption key and/or additional information on the person of the owner of the laptop (or other designee) such that any attempt to access the laptop without the additional information would fail. For example, the information may be saved on a flash drive or on a bluetooth addressable device.

If a digital hash of each file is kept in the compound stream, the present innovations may be used to double-check if a computer has had its content modified. (Typically limited to the files covered in the stream.)

B. A second implementation technique under UNIX-derived environments involves creation of a pseudo-ile system with the above features. Here, the user is given a folder or directory which would contain securely stored files. In reality the folder is the mount point for this new file system. Internally, the file system would use aspects of the innovations herein to split the contents into a number of streams. Some streams (0 or more) but not enough for recovery would then be stored in a shadow directory somewhere on local storage. Some streams (0 or more) could be stored on a removable storage device. Some streams (0 or more) could be stored via the internet (using the SFTP protocol or similar). The net result is that most of the information is local and quickly accessible. As such, only a small amount of information need come over the remote connection, making accesses essentially independent of Internet latency and throughput. Loss of the external streams would make recovery impossible but the file names would still be visible.

The libFuse user space file system library is one technique enabling this process. Furthermore, for systems that create additional redundant streams, these streams could be pushed to remote servers or other storage devices such that the loss of the laptop is recoverable as well as all file modification.

In the case of MS Windows, a guested file system may be used, as well as a file system filter (the same technique used for compression, encryption and antivirus checking), among other techniques.

C. Objects/Creation from Editing Field Codes

Under this implementation, a standard application program such as a spreadsheet program opens a file by making the standard operating system request. Internally, the operating system redirects the open request to the user space file system through the Fuse library or equivalent. (This library provides a simple way to install new file systems without rebuilding the kernel. It does not play a specific, 'magic' value here.) The opened file actually exists as some number of streams on local storage (accessed back through the local file system) and some on remote storage (accessed over the internet via a protocol such as SFTP). (This could be one or several remote servers. Encryption could be incorporated along with compression and caching.) The file system then opens both the local and remote storage (Indeed, one implementation may have zero streams locally in some cases—to force all accesses to be remote, and for all streams to be locally for performance with non-sensitive data. Here, one preferred implementation may support a range of these options for flexibility). Subsequent read operations are translated into reads against local and remote streams as required to feed the Pluribus library and recover the data. Writes work analogously (Extra streams can be written and stored remotely to the same or different servers to handle the problem of data loss more cleanly. If a laptop is lost after making changes, the state of the files can be recovered in the most recent updates.).

Such Implementations Take into Consideration:

The size of the file may be wrong in the file system. As a result, the actual length must be maintained explicitly. Similarly, here, systems/methods consistent with the innovations herein may require that the streams written be based upon files padded to a suitable width.

Files which exist purely locally or purely remotely introduce overheads.

Encryption key management

Compression management

Performance when writing extra streams or the window of vulnerability if spooling these writes.

detecting when an Internet connection goes.

When using these innovations to store data (in ROMs, flash devices, disks, CD/DVD-ROMs, etc.), aspects of the transforming/coding innovations herein may enable a 'top secret' device (such as electronic intelligence or elint equipment in an intelligence gathering plane such as a P-3 Orion)

to be disabled by simply pulling out one of a set of (perhaps not identical) memory devices and destroying/wiping/loosing it.

For example, if a plane with sensitive information is forced down by, e.g., enemy aircraft, the crew has about 45 minutes to destroy the equipment. If the software had been stored using the transformation/coding innovations herein, not only could it be stored in a more reliable fashion but, also, destroyed more quickly. These advantages carry over to any situation in which one needs to be absolutely certain that the data is destroyed or that it needs to be destroyed quickly and unambiguously.

Remote/Cloud Storage Implementations

Figure 16:
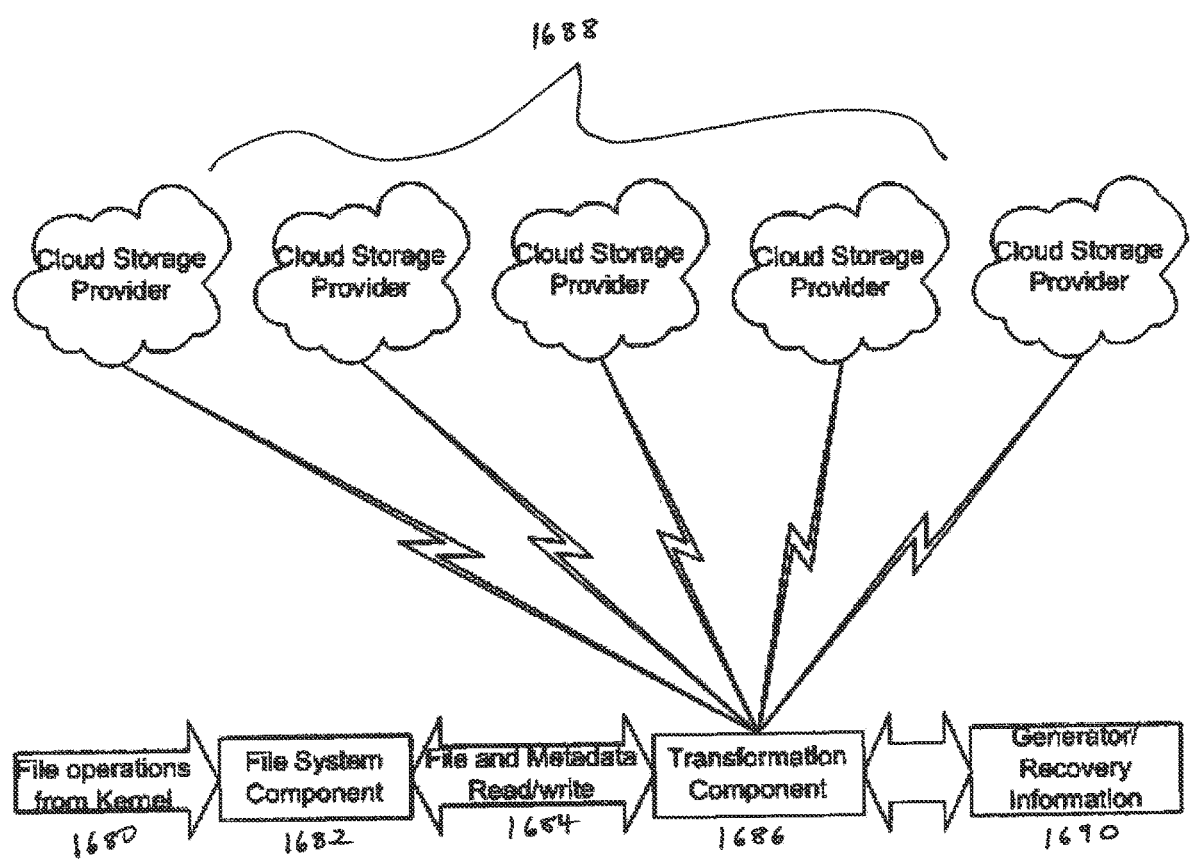
FIG. 16 is a block diagram illustrating an exemplary remote storage arrangement consistent with certain aspects related to the innovations herein.

FIG. 16 is a block diagram illustrating an exemplary remote storage arrangement consistent with certain aspects related to the innovations herein. Referring to FIG. 16, an exemplary arrangement of using information transformed/coded herein for remote Cloud storage are shown. According to the exemplary arrangement, file system operations 1680 from the local operating system kernel (such as through the VNode interface 1360 or the FUSE library 1316 interface) go through the file system component 1682 which maps file requests against remotely stored objects through a read/write interface 1684. A transformational component 1686 provides the transforming/coding (i.e., splitting/joining) for the read/write operations and performs the read/write operations against the specified remote ("Cloud") storage services 1688 via the internet. The generator/recovery information 1690 is the Pluribus information required to create/split/recover the original plaintext data from the remote storage facilities. Caching may take place at many places without loss of generality. Further, remote locking features may be included to enable sharing of files.

Hierarchical Implementations

Figure 17A:
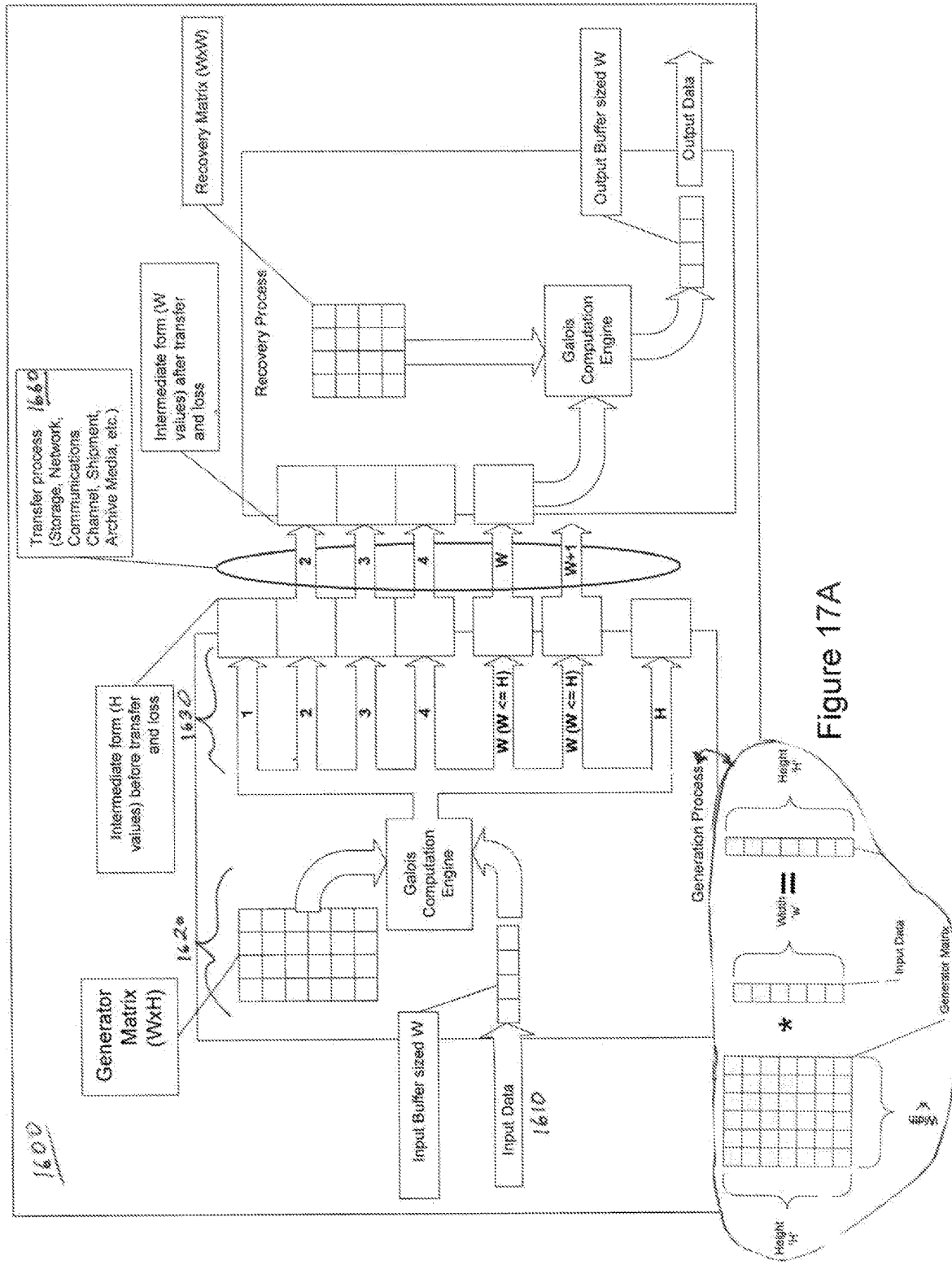
FIGS. 17A-17D are block diagrams illustrating exemplary hierarchical environments/implementations consistent with certain aspects related to the innovations herein.

FIG. 17A illustrates a block diagram of an exemplary environment (system or method) consistent with certain aspects related to the innovations herein. Referring to FIG. 17A, environment 1600 may comprise transformation components/processes 1620, shown generally here, that receives input data 1610, which may also include plaintext data. Via any of the variety of circuitry, components or processes set forth herein, transformation component/process 1620 generates a quantity (H) of output data streams 1630 consistent with one or more of the features and/or advantages herein. As indicated above, according to certain further implementations, information in the H output data streams 1632, 1634, 1636, etc, may also be handled or utilized in a variety of additional implementations, such as in transmission over a network, storage, shipment, transfer processes 1660, etc., in connection with achieving the innovations herein. Consistent with the innovations below, for example, the H output data 1630 are utilized/stored/embodied in the relevant computing environments as general data groups, i.e., as opposed to realization as the stream- and stripe-storage implementations set forth above.

Figure 17B:
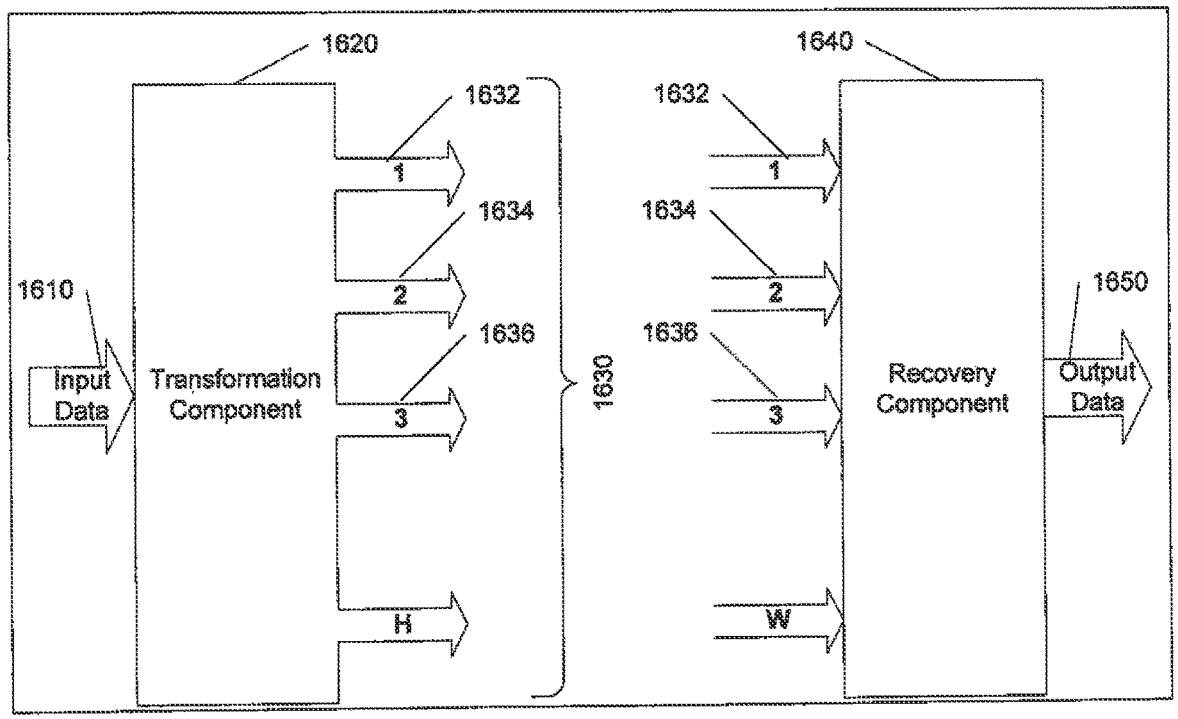
Figure 17C:
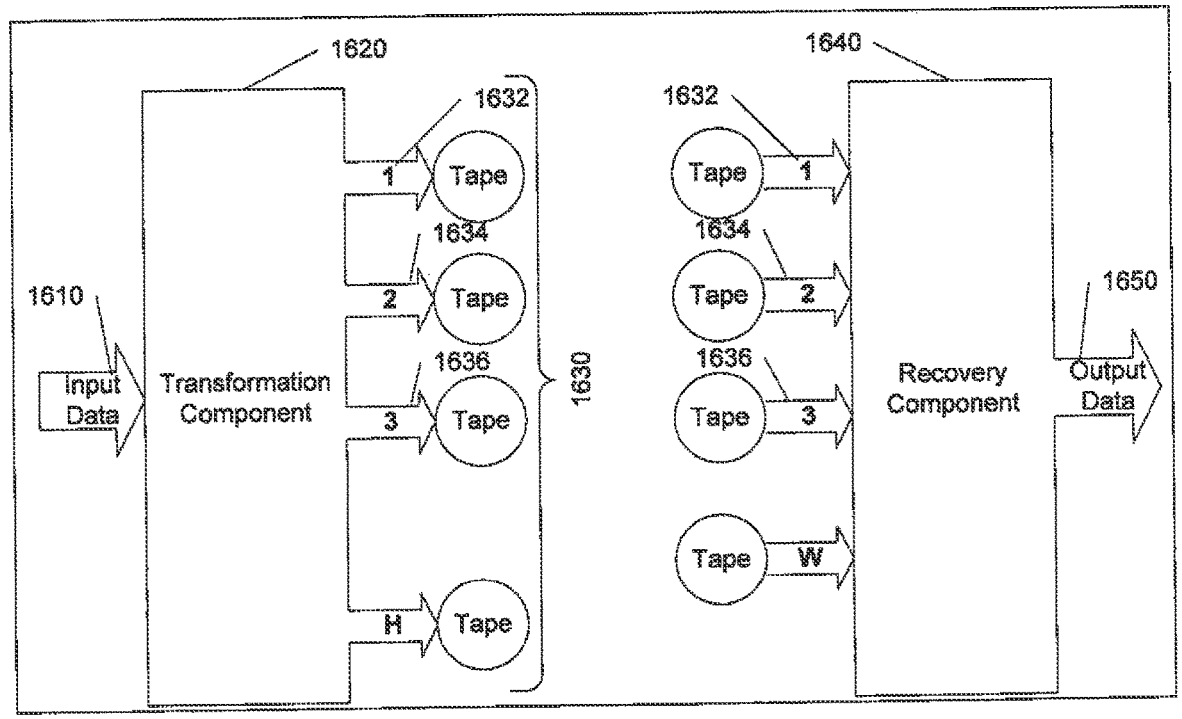
Figure 17D:
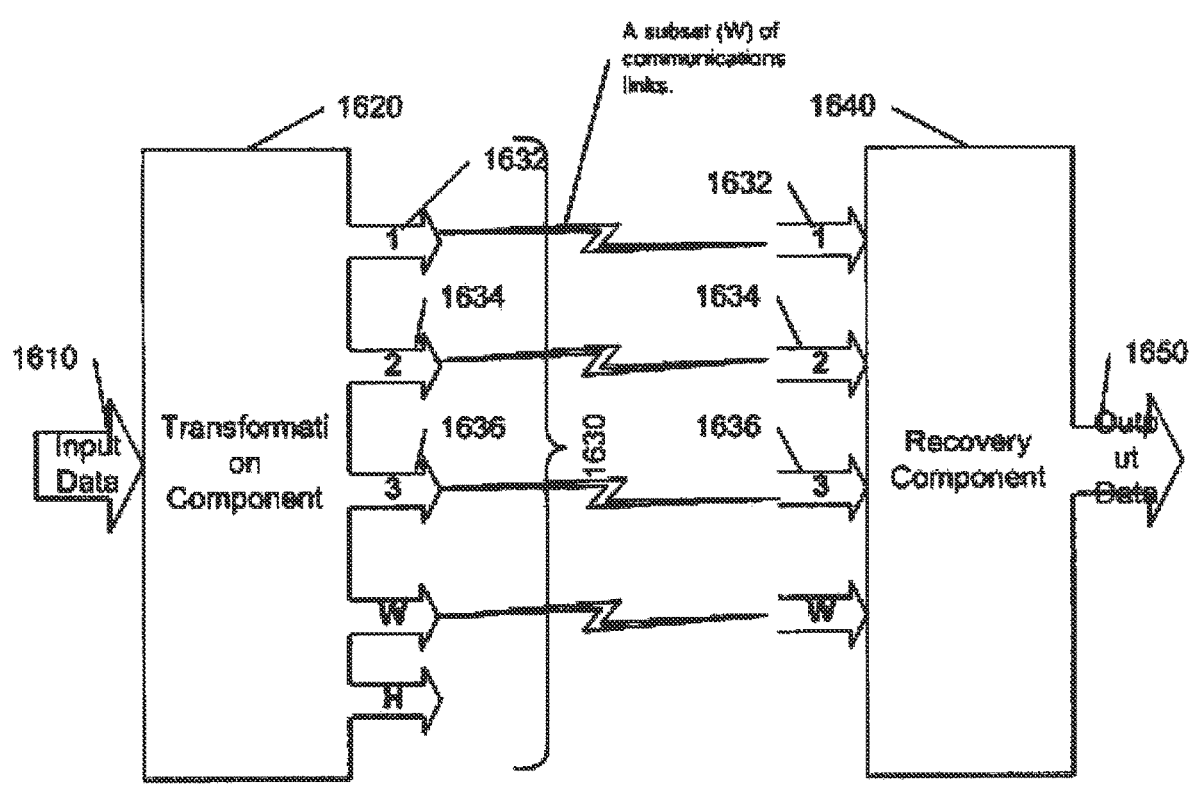

FIGS. 17B-17D illustrates a block diagram of an exemplary hierarchical environments and/or implementations consistent with certain aspects related to the innovations herein. By way of example, FIG. 17B illustrates one illustrative depiction of the pre-information of initial H output data streams 1632, 1634, 1636, etc., i.e., prior to packaging, handling or utilization in the hierarchical implementations here. FIG. 17C illustrates a block diagram of an exemplary implementation consistent with certain aspects related to the innovations herein. In the example of FIG. 17C, transforming/coding aspects of the innovations herein are used to split a data stream intended for multiple tapes. Not all of the tapes need survive to re-obtain the recovery component, while the input data may be recovered completely. According to the exemplary implementation of FIG. 17D, the transformation/coding features are used to split a data stream which is then forwarded across communications links. (This drawing is illustrative of many different real world configurations, here). Further, it should be noted that not all links need be or are functional.

In accordance with such hierarchical/grouping aspects, exemplary methods, consistent with certain aspects related to the present invention, are provided for processing data including producing W data inputs from input data and providing H groups of data from H discrete output data streams generated from the W data inputs, wherein the W data inputs are recoverable via a recovery process capable of producing the W data inputs from any W members of the H groups of data. Moreover, the method may include providing the H groups of data via application of the W data inputs to one or more transforming components that perform a transformation process using Galois field operations and a generator matrix characterized as being invertible in all subsets encounterable during recovery of the input data. In further exemplary implementations, H may be greater than or equal to W and the transformation process may include, for each of the W inputs, producing an H-sized intermediary, combining all H-sized intermediaries into one H-sized result, and processing the one H-sized result into the H discrete groups of data.

Figure 18:
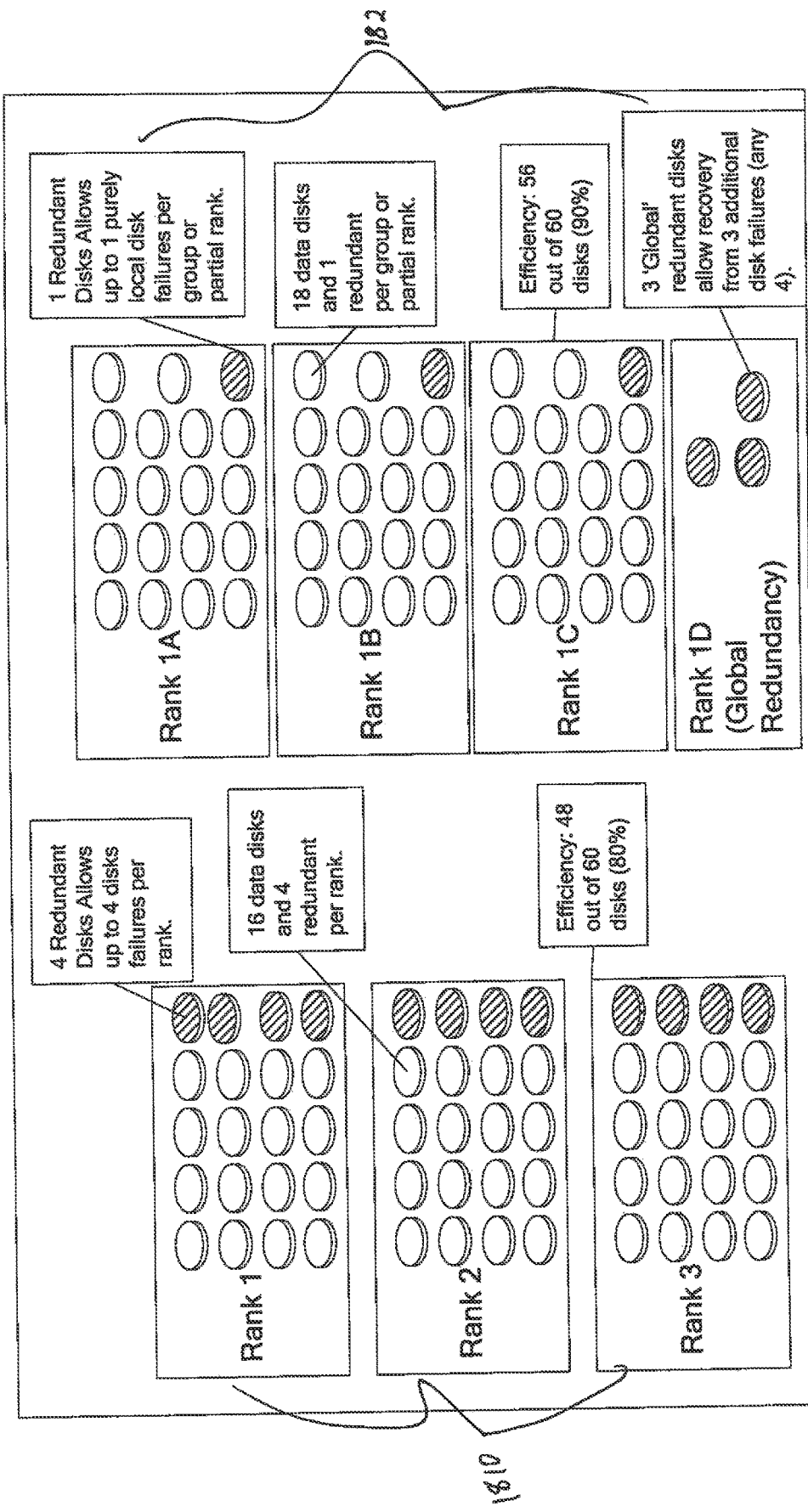
FIG. 18 is a diagram illustrating an exemplary hierarchical environment/implementation consistent with certain aspects related to the innovations herein.

For purposes of analysis, aspects of the innovations here may be illustrated in a system with 3 ranks of disks, each with 20 disk drives. In contrasting disclosures, these drives would typically be operated as three sets of 16:4 (16 data drives, 4 local redundant drives; see, e.g., 1810 of FIG. 18) or some similar arrangement. (Note this comparative discussion ignores the use of redundant only storage for the sake of simplicity, though without loss of generality.) In such disclosures, then, there are 48 data disks and 12 redundant disks in a system capable of surviving the loss of any 4 (and potentially up to 12) disk drives. This loss of 20% of the disk drives is oftentimes unacceptable, however, as storage efficiency is down to 80%. Moreover, the loss of one drive is much more likely than the loss of two drives, which is in turn much more likely than the loss of three drives. And, statistically, the loss of four drives is much less likely than the loss of 1-3 drives.

In accordance with the present disclosure, however, the innovations herein include utilization with 3 arrays of 16:4 ratio, with 3 disks for global redundancy to 3 arrays of 19:1 ratio, with 3 disks for global redundancy. In the illustrative implementation of FIG. 18, an exemplary arrangement 1820 of disks comprises 3 arrays of 19:1, with 3 disks for global redundancy. This implementation allows for 4 failures and still provides 19×3 or 56 data disk equivalence versus 3×16 or 48 disks in contrasting arrangements. Referring to a specific exemplary environment, here, another illustrative implementation may take the form of 3 arrays of 18:2, while reserving 2 additional disks for global redundancy. As such, recovery from the loss of one drive is easier than from four. Moreover, here, the loss of any two drives is a purely local event but the loss of a third and/or fourth drive is a 'global' event. Accordingly, only 8 drives would be lost to storage, so there are 4 more available for data. Further, depending upon reliability, aspects of the innovations herein could be implemented three times 19:1 plus three more redundant drives somewhere for 54 data drives and six redundant drives, or 90% storage efficiency. An, indeed, in an even more efficient implementation, the ranks may be joined into one 56:4 array which would be more storage efficient.

Operationally, such local/global implementations have no implications for normal read operations. Writes, however, are more complex since some of the redundancy is purely local and some of it spans all three ranks. Redundancy generation schemes, here, may be achieved based upon extensions of the generator matrix features above. An exemplary configuration follows, comprised of two 3:1 arrays plus an additional global redundancy disk, with incoming data disks D1-D6 and outgoing disks are R1 . . . R9.

$$\begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ G1 & G1 & G1 & 0 & 0 & 0 \\ 0 & 0 & 0 & G2 & G2 & G2 \\ G3 & G3 & G3 & G3 & G3 & G3 \end{bmatrix} \cdot \begin{bmatrix} D1 \\ D2 \\ D3 \\ D4 \\ D5 \\ D6 \end{bmatrix} =$$

$$[R1 \quad R2 \quad R3 \quad R4 \quad R5 \quad R6 \quad R7 \quad R8 \quad R9]$$

As set forth above, G1 corresponds to one row of the 3×4 generator matrix (paired with the identity sub matrix above). G2 corresponds to another row of the 3×4 generator matrix (pair with the identity sub matrix above it). Outside of the bottom row of the generator matrix, such arrangement comprises two parallel 3×4 matrices which take 3 disks in and give 3:1 out.

Moreover, the bottom-most line in the above arrangement is the 'global' line. Overall, the loss of any drive corresponds to the loss of the corresponding rows in the generator matrix. As long as any square subset of the generator matrix is invertible (not singular), however, then the original data (D1-D6) is recoverable from the remaining R drives.

Using this approach, it is possible to create redundancy groups, or collections of disks (or other data streams) that contain data which is computationally linked via the transformation relationships set forth herein. In the above implementation, for example, disks R1 through R9 are consistent with such redundancy groups.

Figure 19A:
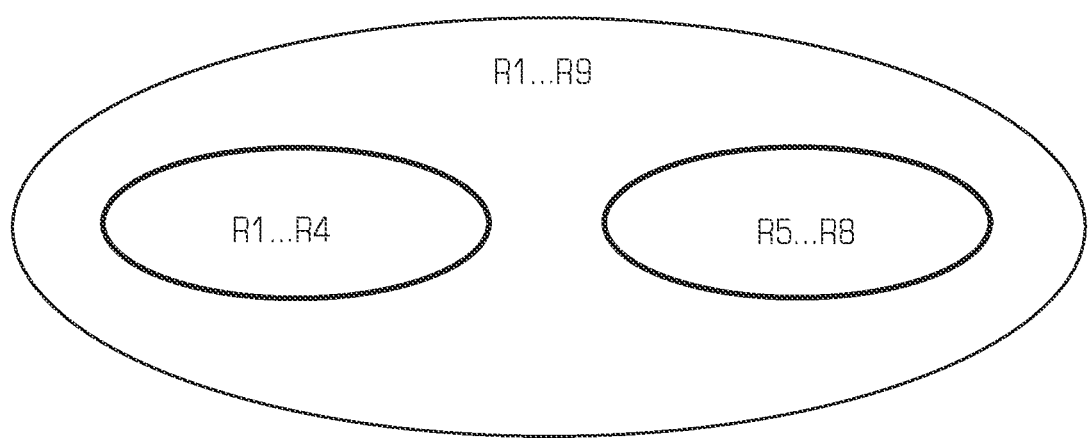
FIGS. 19A-19B are block diagrams illustrating exemplary hierarchical environments/implementations consistent with certain aspects related to the innovations herein.
Figure 19B:
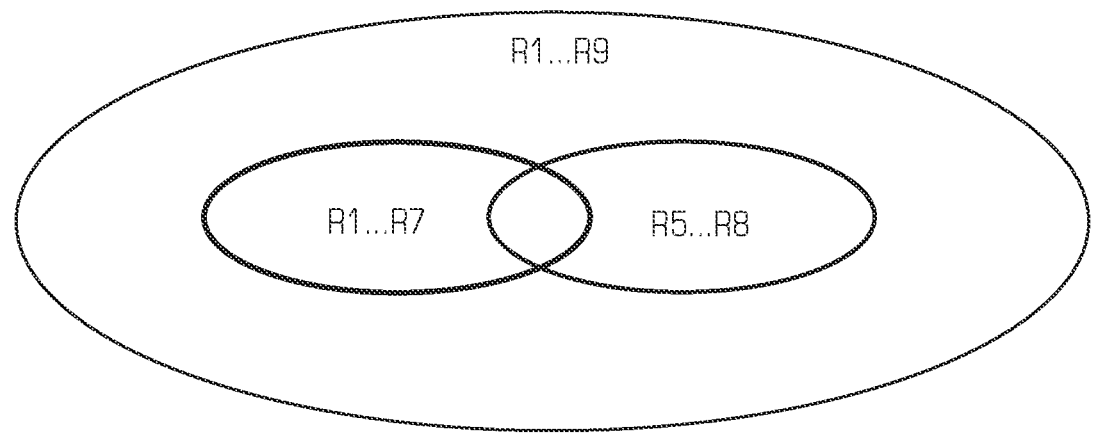

Additionally, however, drives R1 through R4 may also be viewed as such a group, and R5 through R8 may also be viewed as such a group. Referring to FIG. 19A, such relationships may also be illustrated via Venn diagrams. Moreover, arrangements of even greater complexity, such as shown via the overlapping diagrams of FIG. 19B, are also utilized in certain applications.

Placement

Further, there is no requirement that the components of a redundancy group need to be adjacent or have any fixed location with respect to the pieces. Indeed, the only requirements are that the system needs to be able to access all of the members of the group and that a potential failure does not infringe upon failure models associated with the innovations above (e.g., by storing too many objects on the same disk such that the loss of the disk will result in an irrecoverable situation, etc.). Placing the members in a disk stripe has the advantage of keeping the group together while maintaining the failure model and requiring a minimum of external book keeping, but it may not be the optimal solution. In fact, the members of a redundancy group need not be stored 'locally' in any sense of the word if tracking information is maintained.

Hierarchical Redundancy

Figure 20:
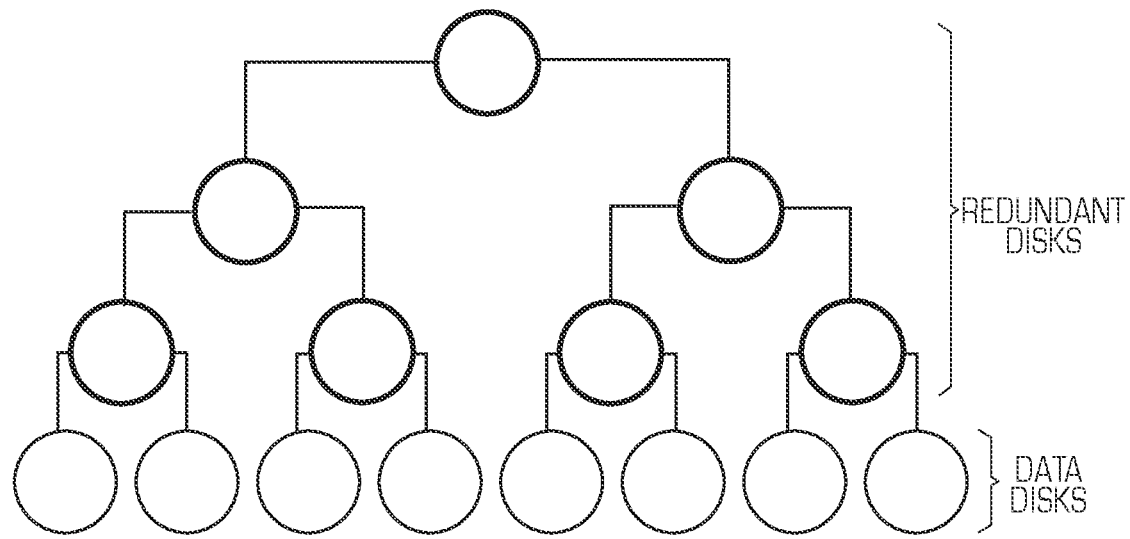
FIGS. 20-21 are diagrams illustrating exemplary implementations consistent with certain aspects related to the innovations herein.

FIG. 20 illustrates an exemplary environment with redundant disks being situated in a multi-tiered arrangement. Of course, available disk tree arrangements, here, extend further than the exemplary implementation shown in FIG. 20. Referring to FIG. 20, however, a diagram illustrating a fully balanced binary hierarchy of redundant storage is shown. Here, the number of redundant drives may be one less than the number of data disks; and the number of branch nodes may be one less than the number of leaf nodes. This approach overcomes drawbacks as utilized within the present innovations. For example, the loss of a data drive is an almost completely 'local' event, but larger failures are also readily handled. (Write processing may yet benefit from write optimization efforts, however.) Further, a worst case quantity of disks which can be lost without data loss is equal to the number of levels of branch nodes −log 2(n). Moreover, there is no requirement that this approach must be limited to balanced binary trees. Indeed, other variations have the following characteristics:

Unbalanced trees—allows for an arbitrary number of data disks (at some potential lost of efficiency)

Non-binary configurations—e.g., a 4 way tree that provides 16 data drives and only 5 redundant drives. The redundancy level is proportional to proportional to $\log_{branching\ factor}(n)$. In this case $\log_4(16)=2$, thus any two drives can be lost without loss of data. The number of drives expended for redundancy is the same as for n-ary trees and branch or internal nodes.

Truncated configurations—removal of the root or top level results in n independent trees.

Failure Analysis

Aspects of the present innovations are also applicable to failure analysis. Here, for example, real world (~4%) annual disk failure rate yields about 1% disk failures per quarter or one failure for each 220,000 disk runtime hours, with about 1014 bits (11.3 TB) between read errors. Further, assuming 2 TB disks (241 bytes or 232 512 byte sectors) and an average sustained disk read/write speed of 128 MB/second (227 bytes/second or 218 512 byte sectors/second), reading a 2 TB disk will require 241-27=214 seconds which is 273 minutes or about 4.5 hours. Thus, once a disk failure determination is made, the fastest the rank will be emptied is 4.5 hours. If the rank is set up according to traditional arrangements, e.g., 164, etc., then 32 TB of data will have been processed and 3 hard read errors would be expected during evacuation. As such, about once in each 2500 evacuations, another of the 19 remaining disks will fail. An applicable equation for RAID 6 (dual failure supporting arrays) is:

$$MTTF(\text{array}) = \frac{MTTF^3(\text{disk})}{N(G-1)(G-2)MTTR^2(\text{disk})}$$

where N is the number of disks in the environment and G is the number of disks in the array.

With disk MMTF in the 200K hour range, and the MTTR in the 5 hour range.

Networking

Use of these hierarchical implementations also include innovations in the areas of network protocols and/or Forward Error Correction. For example, implementations of the present innovations may be configured such that local data losses are handled by local redundant messages, while larger data losses are handled by higher/intermediate (data/group]

levels. According to one illustrative scheme, for example, a network data stream may be divided into discrete messages of uniform size (e.g., 1K each) and these messages are grouped into 'chapters' of say 64 messages each, with 64 chapters grouped into a 'section' and so on.

For example, aspects of the innovations herein may process each of the messages within a chapter to produce say 70 new messages, such that the data groups are structured 64:6 (i.e., posses the ability to loose 6 datagrams without loss of data). Further, each section is then processed such that at the end of each section there are 64 additional messages generated from global redundancy. As such, the local data losses (or "drop outs") will be handled by local redundant messages, while larger drop outs—up to the size of an entire chapter—can be handled at the section level. Further, this hierarchical approach can be applied as many levels deep as desired. Moreover, the size of coverage and the number of redundant messages can be changed as desired. Another aspect that overcomes drawbacks of existing arrangements is that the total number of redundant packets that must be kept in memory goes down dramatically.

Mixed Calculations

Figure 21:
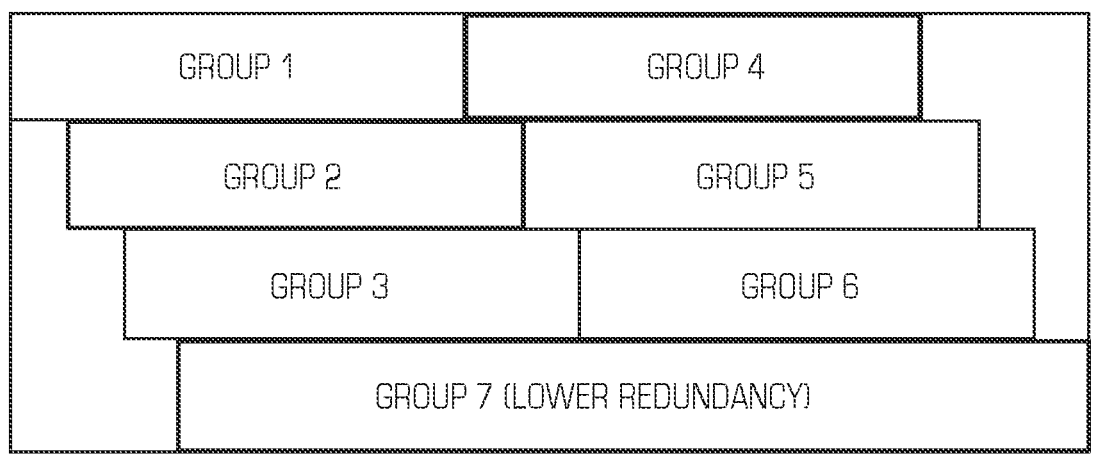

Innovations may also include producing a hybrid generation matrix such that some data streams would have one level of redundancy and other data streams would have another, while using the same outputs. Implementations, here, provide some objects having different reliability than other objects within the same group (if specifying redundancy by group) or stripe (if specifying redundancy by stripe). Accordingly, such implementations enable 'smearing' of these mixed calculations across overlapping groups as shown via the exemplary diagram of FIG. 21.

Transformed/Coded Features within Objects

Aspects of the innovations above place redundancy as a function of the rank's internal organization. However, components transformed/coded consistent with the innovations herein may also be converted to objects which are then explicitly managed by the object storage system. For example, according to first implementations here, such transformed/coded objects may be placed and/or managed in the context of the current stripes. Here, this may take the form of explicit use and manipulation of such transformed/coded objects within the stripes.

According to second implementations here, these transformed/coded objects are managed as stand-alone objects within the system. In one realization of such stand-alone implementations, for example, the placement constraints of the transformed/coded objects are added to the placement algorithm. Further, such stand-alone implementations have the advantage that redundant objects may be stored anywhere within the system, including within other ranks.

Groupings within Objects

Transforming/coded objects and features of their redundancy are not limited to objects within a stripe. As such, aside from the placement restrictions, there is no specific restriction on what objects may be placed within a single collection of objects to be covered by the transformation/coding regimes above within one tenure.

In further implementations, for example, a grouping of over 200 objects written concurrently to the system is made via the transformation/coding herein, with the redundancy objects (ROs) being written afterwards. Here, the objects are written in such a way that the loss of one or more disk drives does not violate the minimum required information content. This may entail writing many more than one object to a single disk drive. In implementations here, e.g., several stripes (potentially across several ranks) could be consolidated into a group. A central aspect of these implementations is that, if the redundancy objects are based upon redundancy groups, then any set of objects may be placed into a redundancy group up to the recovery limit for that configuration and the redundancy objects can then be written to the system. However, as long as the location dependencies are met, the objects may be written anywhere. This may entail additional bookkeeping to know which redundancy group contains which objects and which redundancy objects correspond to which redundancy group. By way of a simplistic illustration, one or more ranks are dedicated to hold redundancy objects with the other ranks holding only data objects. The data ranks then operate essentially like RAID 0 or RAID 10 arrays, while the redundancy groups are stored in a transactional model against the other devices.

In the present description, the terms component, module, and functional unit, may refer to any type of logical or functional process or blocks that may be implemented in a variety of ways. For example, the functions of various blocks can be combined with one another into any other number of modules. Each module can be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to graphics processing hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, embodiments and features of the invention may be implemented through computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe components such as software, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein may be implemented as functionality programmed into any of a variety of circuitry, including programmable logic devices ("PLDs"), such as field programmable gate arrays ("FP- GAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Other embodiments of the invention will be apparent to those skilled in the art from consideration of the specification and practice of the invention disclosed herein. It is intended that the specification and examples be considered as exemplary only, with a true scope and spirit of the invention being indicated by the disclosure above in combination with the following paragraphs describing the scope of one or more embodiments of the following invention.

The invention claimed is:

1. A system that transforms data involving a secure format from which the data is configured to be recovered, the system comprising:
at least one a processor that produces a first quantity (W) of data inputs from input data;
one or more transforming components that perform a transformation process on the W data inputs to transform the input data into the secure format using a generator matrix having a generator matrix structure including first registers that store variables of the generator matrix with an encoder device, the generator matrix comprising a Galois field structure including coefficients stored in the first registers and characterized as being invertible in all subsets encounterable during recovery operations of the input data based on a recovery matrix;
a generating component that generates a second quantity (H) of discrete output data streams from the W data inputs;
wherein the transformation process includes:
a generation process that:
for each of the W inputs, produces an H-sized intermediary; and
processes a plurality of H-sized intermediaries into the H discrete output data streams; and
a transfer process that performs processing to handle the H discrete output data streams for transmission over a network, storage in memory, shipment or transfer prior to recovery at a decoder device;
wherein the W data inputs are configured to be recovered via a recovery process involving recovery coefficients calculated and saved into second registers of the recovery matrix with a decoder device, the recovery process producing the W data inputs from any W members of the H discrete output data streams; and
wherein the system is configured to recover the data via the recovery process, wherein the recovery process utilizes the recovery coefficients of the recovery matrix to recover the input data back from the secure format.

2. The system of claim 1 wherein the system stores a check value to allow comparison of check values from before and after processing, movement and/or storage to verify correctness of a result.

3. The system of claim 1 wherein the system stores a check value to allow quick isolation of errors at various processing stages.

4. The system of claim 1 wherein the system stores a check value to enable alternate recovery stream subsets or chapter subsets to be used for a region of a stream to recover proper data.

5. The system of claim 1 wherein the system applies a check value to one or more of the H output data streams and/or the W input data streams or any prior data stream.

6. The system of claim 1 wherein the system stores a check value to allow comparison of hashes from before and after processing, movement and/or storage of the input data to verify correctness of a result.

7. The system of claim 1 wherein the system regenerates data stored in any disparate data stores via at least W of the H output data streams without revelation of the input data.

8. The system of claim 1, wherein each of the H output streams is stored in a separate data store such that access to W separate data stores is required to recover the input data.

9. The system of claim 1 wherein system stores the H discrete output streams in disparate data stores.

10. The system of claim 9, wherein the disparate data stores are located in different jurisdictions.

11. The system of claim 9 wherein the disparate data stores are located in multiple jurisdictions.

12. The system of claim 9 wherein the disparate data stores are located in different countries.

13. The system of claim 9 wherein the disparate data stores are located in multiple countries.

14. The system of claim 9 wherein the disparate stores are located in a collection of different and/or multiple jurisdic- 15. The system of claim 1 wherein the data stored is backup, historical or archival data.

16. The system of claim 15, wherein the system transforms and stores data including a flag or segment classifying the data as requiring storage which is both redundant (safe) and secure.

17. The system of claim 1 wherein the system applies a check value to one or more of the H output data streams and/or the W input data streams or any prior data stream.

18. The system of claim 1 wherein the system is configured to apply rearranged rows of the generator matrix to further scramble the input data, wherein information regarding the rearranged rows serves as a cryptographic key.

19. The system of claim 1 wherein the system is configured to:
store data with an error check or correction code, wherein the error check or correction code is grouped with its associated data such that mathematical relation between data is maintained in the transformed data; and
recreate an error check or correction code header based on the transformed data.

20. The system of claim 1, wherein the system applies rearranged rows of the generator matrix to further scramble the input data, wherein information regarding the rearranged rows serves as a cryptographic key.

21. The system of claim 1, wherein the system:
stores data with an error check or correction code, wherein the error check or correction code is grouped with its associated data such that mathematical relation between data is maintained in the transformed data; and
recreates an error check or correction code header based on the transformed data.

22. The system of claim 1, wherein the system is configured to:
store data with an error check or correction code in SIMD registers, wherein the error check or correction code is grouped with its associated data within the SIMD registers such that mathematical relations between data is maintain in the transformed data; and
recreate the error check or correction code based on the transformed data.

23. The system of claim 1, further comprising one or both of:
a file system component and a read/write interface, wherein the file system component maps file requests against remotely stored objects through the read/write interface; and/or
at least one additional transforming component that provides transformation of and/or coding for read/write operations and performs the read/write operations to read data from and write data to cloud storage devices.

24. The system of claim 1, wherein the transformation component comprises at least one hierarchical transformation component.

25. The system of claim 1, wherein the system is configured to apply rearranged rows of the generator matrix to scramble the input data, wherein information regarding the rearranged rows serves as a cryptographic key to unscramble the input data.

26. The system of claim 1, wherein one or both of:
every row of the generator matrix is linearly independent of all other rows of the generator matrix; and/or
every row of the recovery matrix is linearly independent of all other rows of the recovery matrix.

27. The system of claim 1, wherein the system is configured to perform multiplication and division operations using discrete logarithms or a process that involves said discrete logarithms.

28. The system of claim 1, wherein the system is configured to store one or more check values and perform comparison of the one or more check values from before and after at least one processing, movement and/or storage operation to verify correctness of results of the at least one processing, movement and/or storage operation.

29. The system of claim 1, wherein the system is further configured to include one or more check values that provide error correction in addition to erasure recovery.

30. The system of claim 1, wherein the input data includes data structures, and wherein the system is configured to encode the data structures into SIMD registers via the transformation process to produce encoded datagrams for transmission.

* * * * *